(12) United States Patent
Nishio et al.

(10) Patent No.: US 12,445,111 B2
(45) Date of Patent: Oct. 14, 2025

(54) HIGH FREQUENCY MODULE AND COMMUNICATION DEVICE

(71) Applicant: Murata Manufacturing Co., Ltd., Kyoto (JP)

(72) Inventors: Keisuke Nishio, Kyoto (JP); Masanori Kato, Kyoto (JP); Syunsuke Kido, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 188 days.

(21) Appl. No.: 18/457,444

(22) Filed: Aug. 29, 2023

(65) Prior Publication Data

US 2023/0402996 A1 Dec. 14, 2023

Related U.S. Application Data

(63) Continuation of application No. PCT/JP2022/007469, filed on Feb. 24, 2022.

(30) Foreign Application Priority Data

Mar. 2, 2021 (JP) .................................. 2021-033005
Jun. 4, 2021 (JP) .................................. 2021-094425

(51) Int. Cl.
*H03H 9/64* (2006.01)
*H03H 9/54* (2006.01)

(52) U.S. Cl.
CPC .......... *H03H 9/6433* (2013.01); *H03H 9/542* (2013.01)

(58) Field of Classification Search
CPC .... H03H 9/6433; H03H 9/542; H03H 9/6483; H03H 9/0542; H03H 9/0557; H03H 9/0576; H03H 9/725
See application file for complete search history.

(56) References Cited

U.S. PATENT DOCUMENTS

2010/0188166 A1* 7/2010 Hara ...................... H03H 9/605
333/133
2013/0141185 A1* 6/2013 Tsutsumi ............... H03H 9/584
333/195
(Continued)

FOREIGN PATENT DOCUMENTS

JP 2017-199969 A 11/2017
JP 2020-014204 A 1/2020
(Continued)

OTHER PUBLICATIONS

International Search Report for PCT/JP2022/007469 dated May 17, 2022.

*Primary Examiner* — John W Poos
(74) *Attorney, Agent, or Firm* — McDonald Hopkins LLC

(57) ABSTRACT

To suppress degradation of characteristics, a high frequency module includes a mounting substrate, a first signal terminal, a second signal terminal, and ground terminals, and a hybrid filter. The hybrid filter is coupled between the first signal terminal and the second signal terminal. The hybrid filter includes an acoustic wave filter having at least one acoustic wave resonator, a first inductor, and a capacitor. The pass band width of the hybrid filter is larger than that of the acoustic wave resonator. A resin layer is disposed on a first principal surface of the mounting substrate. The resin layer covers at least part of the acoustic wave filter. A metal electrode layer covers at least part of the resin layer, and is coupled to the ground terminals. The second inductor is coupled between the hybrid filter and the second signal terminal.

20 Claims, 6 Drawing Sheets

(56) References Cited

U.S. PATENT DOCUMENTS

| | | |
|---|---|---|
| 2017/0134005 A1 | 5/2017 | Takeuchi et al. |
| 2017/0309679 A1 | 10/2017 | Kawasaki |
| 2019/0123717 A1 | 4/2019 | Gavryliuk et al. |
| 2020/0028479 A1 | 1/2020 | Ta et al. |
| 2020/0058436 A1 | 2/2020 | Nakagawa |
| 2020/0235714 A1* | 7/2020 | Jeong .................. H03H 7/1783 |
| 2021/0265976 A1 | 8/2021 | Nakahashi |
| 2021/0265979 A1* | 8/2021 | Inoue .................. H03H 9/0542 |
| 2021/0313962 A1* | 10/2021 | Sugaya ................ H03H 9/0523 |

FOREIGN PATENT DOCUMENTS

| | | |
|---|---|---|
| JP | 2021-500838 A | 1/2021 |
| WO | 2016/013659 A1 | 1/2016 |
| WO | 2018/225590 A1 | 12/2018 |
| WO | 2020/105589 A1 | 5/2020 |

\* cited by examiner

HIGH FREQUENCY MODULE AND COMMUNICATION DEVICE

CROSS REFERENCE TO RELATED APPLICATION

This is a continuation of International Application No. PCT/JP2022/007469 filed on Feb. 24, 2022 which claims priority from Japanese Patent Application No. 2021-033005 filed on Mar. 2, 2021 and Japanese Patent Application No. 2021-094425 filed on Jun. 4, 2021. The contents of these applications are incorporated herein by reference in their entireties.

BACKGROUND ART

Technical Field

The present disclosure generally relates to a high frequency module and a communication device, and more specifically, relates to a high frequency module including a hybrid filter and a communication device including the high frequency module.

Patent Document 1 discloses a hybrid acoustic LC filter (hybrid filter) including an acoustic resonator, an inductor, and a capacitor.

Patent Document 1: Japanese Unexamined Patent Application Publication No. 2020-14204

BRIEF SUMMARY

Characteristics in a high frequency module including a hybrid acoustic LC filter disclosed in Patent Document 1 may degrade in some cases such as when a metal electrode layer coupled to a ground terminal is formed as a shield layer, for example.

The present disclosure provides a high frequency module and a communication device in which it is possible to suppress degradation of their characteristics.

A high frequency module according to an aspect of the present disclosure includes a mounting substrate; a first signal terminal, a second signal terminal, and ground terminals; and a hybrid filter. The mounting substrate has a first principal surface and second principal surface that are opposed to each other. The first signal terminal, the second signal terminal, and the ground terminals are disposed on the mounting substrate. The hybrid filter is coupled between the first signal terminal and the second signal terminal. The hybrid filter includes an acoustic wave filter having at least one acoustic wave resonator, a first inductor, and a capacitor. The pass band width of the hybrid filter is larger than that of the acoustic wave resonator. The acoustic wave filter is mounted on the first principal surface of the mounting substrate. The first inductor and the capacitor are disposed in or on the mounting substrate. The high frequency module further includes a resin layer, a metal electrode layer, and a second inductor. The resin layer is disposed on the first principal surface of the mounting substrate. The resin layer covers at least part of the acoustic wave filter. The metal electrode layer covers at least part of the resin layer, and is coupled to the ground terminals. The second inductor is disposed in or on the mounting substrate. The second inductor is coupled between the hybrid filter and the second signal terminal.

A high frequency module according to an aspect of the present disclosure includes a mounting substrate; a first signal terminal, a second signal terminal, a third signal terminal, and ground terminals; a first filter that is a hybrid filter including an acoustic wave filter having at least one acoustic wave resonator, a first inductor, and a capacitor; and a second filter. The mounting substrate has a first principal surface and a second principal surface that are opposed to each other. The first signal terminal, the second signal terminal, the third signal terminal, and the ground terminals are disposed on the mounting substrate. The hybrid filter is coupled between the first signal terminal and the second signal terminal. The second filter is coupled between the first signal terminal and the third signal terminal. The pass band width of the hybrid filter is larger than the pass band width of the acoustic wave resonator. The acoustic wave filter is mounted on the first principal surface of the mounting substrate. The second filter, the first inductor, and the capacitor are disposed in or on the mounting substrate. The high frequency module further includes a resin layer, a metal electrode layer, and a second inductor. The resin layer is disposed on the first principal surface of the mounting substrate. The resin layer covers at least part of the acoustic wave filter. The metal electrode layer covers at least part of the resin layer, and is coupled to the ground terminals. The second inductor is disposed in or on the mounting substrate. The second inductor is coupled between the second filter and the third signal terminal.

A communication device according to an aspect of the present disclosure includes the above-described high frequency module and a signal processing circuit. The signal processing circuit performs signal-processing on a high frequency signal for use in the high frequency module.

In a high frequency module and a communication device according to the above-described aspects of the present disclosure, it is possible to suppress degradation of their characteristics.

DESCRIPTION OF EMBODIMENTS

FIGS. 2 to 4, 6 to 10, and 12 referred to in the following embodiments or the like are all schematic views, and a ratio of sizes or thicknesses of respective components in the figures does not necessarily reflect actual dimensional ratios thereof.

First Embodiment

(1) Overview

Figure 1:
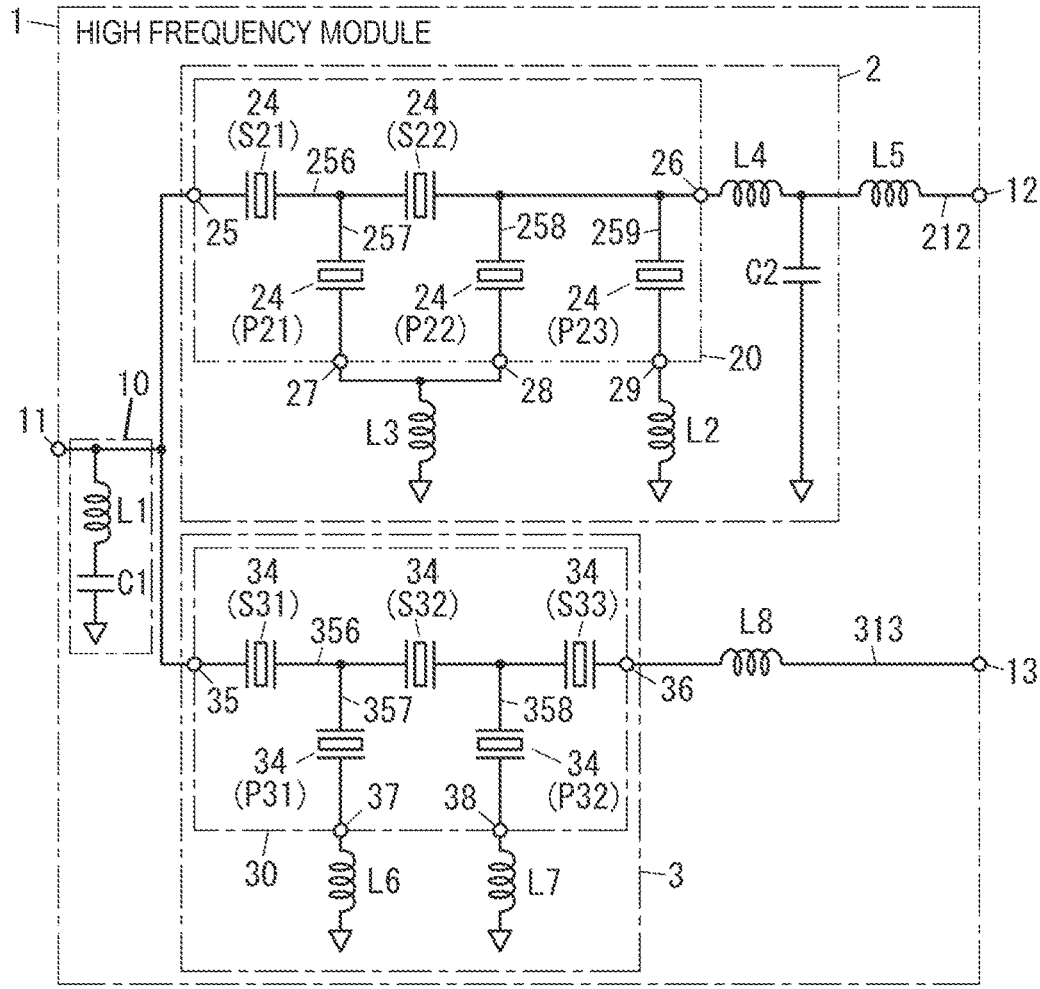
FIG. 1 is a circuit diagram of a high frequency module according to a first embodiment.
Figure 2:
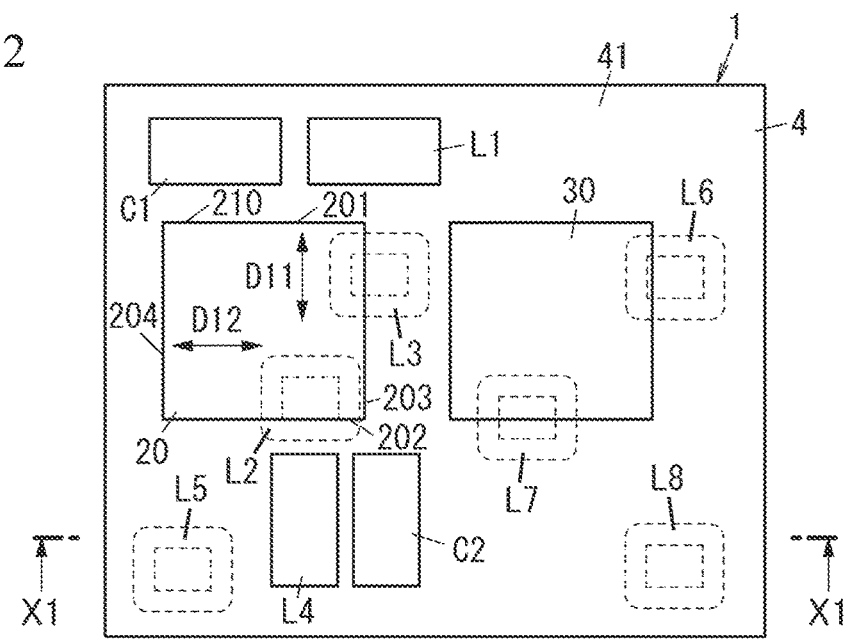
FIG. 2 is a plan view of the high frequency module of the first embodiment.
Figure 3:
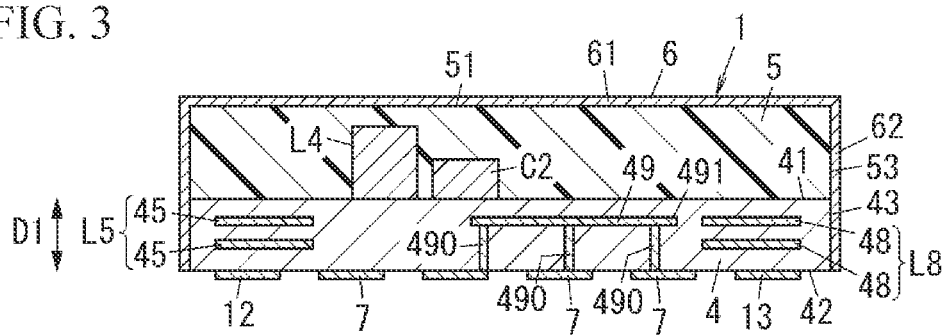
FIG. 3 illustrates the high frequency module of the first embodiment and is a sectional view of X1-X1 line in FIG. 2.

As illustrated in FIGS. 2 and 3, a high frequency module 1 according to a first embodiment includes a mounting substrate 4; a first signal terminal 11 (see FIG. 1), a second signal terminal 12, and ground terminals 7; and a hybrid filter 2 (see FIG. 1). The mounting substrate 4 has a first principal surface 41 and a second principal surface 42 that are opposed to each other. Here, "being opposed" means being opposed geometrically, and not physically. The first signal terminal 11, the second signal terminal 12, and the ground terminals 7 are disposed on the mounting substrate 4. As illustrated in FIG. 1, the hybrid filter 2 is coupled between the first signal terminal 11 and the second signal terminal 12. The hybrid filter 2 includes an acoustic wave filter 20 (hereinafter referred to as a first acoustic wave filter 20) having at least one (for example, five) acoustic wave resonator 24, a first inductor L4, and a capacitor C2. The pass band width of the hybrid filter 2 is larger than the pass band width of the acoustic wave resonator 24. The pass band width of the acoustic wave resonator 24 is a fractional bandwidth of the acoustic wave resonator 24 and is a difference between an anti-resonant frequency and a resonant frequency of the acoustic wave resonator 24. As illustrated in FIGS. 2 and 3, the acoustic wave filter 20, the first inductor L4, and the capacitor C2 are mounted on the first principal surface 41 of the mounting substrate 4. The high frequency module 1 further includes a resin layer 5, a metal electrode layer 6, and an inductor L5 (hereinafter also referred to as a second inductor L5). The resin layer 5 is disposed on the first principal surface 41 of the mounting substrate 4. The resin layer 5 covers the first inductor L4, the capacitor C2, and an outer peripheral surface of the first acoustic wave filter 20. The metal electrode layer 6 covers at least part of the resin layer 5, and is coupled to the ground terminals 7. The second inductor L5 is disposed in or on the mounting substrate 4. As illustrated in FIG. 1, the second inductor L5 is coupled between the hybrid filter 2 and the second signal terminal 12. "The second inductor L5 is coupled between the hybrid filter 2 and the second signal terminal 12" means that the second inductor L5 is coupled to both the hybrid filter 2 and the second signal terminal 12, between the hybrid filter 2 and the second signal terminal 12. Note that the resin layer 5 and the metal electrode layer 6 are not illustrated in FIG. 2.

In addition, as illustrated in FIGS. 1 to 3, the high frequency module 1 further includes a second acoustic wave filter 30, a third signal terminal 13, and an inductor L8 (hereinafter also referred to as a third inductor L8). The second acoustic wave filter 30 is an electronic component that is different from the first acoustic wave filter 20, and is mounted on the first principal surface 41 of the mounting substrate 4. The second acoustic wave filter 30 is coupled between the first signal terminal 11 and the third signal terminal 13. The third signal terminal 13 is a signal terminal that is different from the second signal terminal 12, and is disposed on the mounting substrate 4. The third inductor L8 is disposed in or on the mounting substrate 4. The third inductor L8 is coupled between the second acoustic wave filter 30 and the third signal terminal 13. "The third inductor L8 is coupled between the second acoustic wave filter 30 and the third signal terminal 13" means that the third inductor L8 is coupled to both the second acoustic wave filter 30 and the third signal terminal 13, between the second acoustic wave filter 30 and the third signal terminal 13.

The high frequency module 1 forms a multiplexer 100 (see FIG. 5) that has the hybrid filter 2 (hereinafter referred to as a first filter 2) and a second filter 3 (see FIG. 1) including the second acoustic wave filter 30.

The high frequency module 1 according to the first embodiment will be described in more detail after description of circuit configurations of a high frequency circuit 200 including the high frequency module 1 and a communication device 300 with reference to FIG. 5.

(2) High Frequency Circuit Including High Frequency Module and Communication Device (2.1) Circuit Configuration of High Frequency Circuit Including High Frequency Module and Communication Device The high frequency circuit 200 including the high frequency module 1 is used in the communication device 300, for example. The communication device 300 is, for example, a cellular phone (such as a smartphone), but it is not limited thereto, and may be a wearable terminal (such as a smartwatch). The high frequency circuit 200 is a module compatible with a fourth generation mobile communication (4G) standard, a fifth generation mobile communication (5G) standard, or the like. The 4G standard is, for example, a Third Generation Partnership Project (3GPP) Long Term Evolution (LTE) standard. The 5G standard is a 5G New Radio (NR), for example. The high frequency circuit 200 is a module compatible with carrier aggregation and dual connectivity, for example.

For example, the high frequency circuit 200 is configured such that it can amplify a transmitted signal received from a signal processing circuit 301 and output the amplified signal to an antenna 309. In addition, the high frequency circuit 200 is configured such that it can amplify a received signal received from the antenna 309 and output the amplified signal to the signal processing circuit 301. The signal processing circuit 301 is not a component of the high frequency circuit 200 but a component of the communication device 300 including the high frequency circuit 200. The high frequency circuit 200 is controlled by, for example, the signal processing circuit 301 that the communication device 300 includes. The communication device 300 includes the high frequency circuit 200 and the signal processing circuit 301. The communication device 300 further includes the antenna 309. The communication device 300 further includes a circuit board (not illustrated) on which the high frequency module 1 is mounted. The circuit board is a printed wiring board, for example. The circuit board has a ground electrode supplied with a ground potential.

The signal processing circuit 301 includes, for example, an RF signal processing circuit 302 and a baseband signal processing circuit 303. The RF signal processing circuit 302 is a radio frequency integrated circuit (RFIC), for example, and performs signal processing on high frequency signals.

The RF signal processing circuit 302 performs signal processing such as up-conversion on a high frequency signal (transmitted signal) outputted from the baseband signal processing circuit 303, for example, and outputs the signal-processed high frequency signal. In addition, the RF signal processing circuit 302 performs the signal processing such as down-conversion on a high frequency signal (received signal) outputted from the high frequency circuit 200 and outputs the signal-processed high frequency signal to the baseband signal processing circuit 303. The baseband signal processing circuit 303 is a baseband integrated circuit (BBIC), for example. The baseband signal processing circuit 303 generates an I-phase signal and a Q-phase signal from the baseband signal. The baseband signal is, for example, an audio signal, an image signal, or the like, received from outside. The baseband signal processing circuit 303 performs IQ modulation processing by synthesizing the I-phase signal and the Q-phase signal and outputs a transmitted signal. At this time, the transmitted signal is generated as a modulated signal (IQ signal) obtained by amplitude modulation performed on a carrier wave signal of a predetermined frequency with a cycle that is longer than the cycle of the carrier wave signal. The received signal processed by the baseband signal processing circuit 303 is used, for example, as an image signal for displaying images or as an audio signal for phone calls by users of the communication device 300. The high frequency circuit 200 conveys high frequency signals (received signals and transmitted signals) between the antenna 309 and the RF signal processing circuit 302 of the signal processing circuit 301.

The high frequency circuit 200 includes the multiplexer 100, a plurality of (for example, two) transmitting filters (a first transmitting filter 111 and a second transmitting filter 112), and a plurality of (for example, two) receiving filters (a first receiving filter 121 and a second receiving filter 122). In addition, the high frequency circuit 200 includes a first switch 8 and a second switch 9. The high frequency circuit 200 also includes a plurality of (for example, two) power amplifiers (a first power amplifier 151 and a second power amplifier 152) and a plurality of (for example, two) low-noise amplifiers (a first low-noise amplifier 161 and a second low-noise amplifier 162). In addition, the high frequency circuit 200 includes a plurality of (for example, two) output matching circuits (a first output matching circuit 131 and a second output matching circuit 132) and a plurality of (for example, two) input matching circuits (a first input matching circuit 141 and a second input matching circuit 142).

In addition, the high frequency circuit 200 includes a plurality of external connection terminals. The plurality of external connection terminals include an antenna terminal T0, a first signal input terminal T1, a second signal input terminal T2, a first signal output terminal T3, a second signal output terminal T4, and a plurality of external ground terminals (not illustrated). Each of the external ground terminals is a terminal electrically coupled to the above-described ground electrode of the circuit board of the communication device 300 and supplied with the ground potential.

The circuit configuration of the high frequency circuit 200 is described hereinafter in more detail.

The high frequency module 1 (see FIG. 1) forming the multiplexer 100 includes the first filter 2 (the hybrid filter 2), the second filter 3, the first signal terminal 11, the second signal terminal 12, and the third signal terminal 13. The first signal terminal 11 is a common terminal coupled to the first filter 2 and the second filter 3. The first signal terminal 11 is coupled to the second signal terminal 12 via the first filter 2, and is coupled to the third signal terminal 13 via the second filter 3. Each of the first signal terminal 11, the second signal terminal 12, and the third signal terminal 13 is an input/output terminal utilized for input and output of high frequency signals. As illustrated in FIG. 5, in the high frequency circuit 200, the first signal terminal 11 of the multiplexer 100 is coupled to the antenna terminal T0. The antenna terminal T0 is coupled to the antenna 309.

The first transmitting filter 111 has a pass band including a transmission band of a first communication band. The second transmitting filter 112 includes a pass band including a transmission band of a second communication band. The first communication band is n77 of the 5G NR standard, for example. The second communication band is n79 of the 5G NR standard, for example. The first transmitting filter 111 can be coupled to the first filter 2 of the multiplexer 100 via the first switch 8. The second transmitting filter 112 can be coupled to the second filter 3 of the multiplexer 100 via the second switch 9.

The first receiving filter 121 has a pass band including a reception band of a third communication band. The third communication band is the same as the first communication band, for example. The second receiving filter 122 has a pass band including a reception band of a fourth communication band. The fourth communication band is the same as the second communication band, for example. The first receiving filter 121 can be coupled to the first filter 2 of the multiplexer 100 via the first switch 8. The second receiving filter 122 can be coupled to the second filter 3 of the multiplexer 100 via the second switch 9.

The first switch 8 has a common terminal 80 and a plurality of (for example, two) selection terminals 81 and 82. In the first switch 8, the common terminal 80 is coupled to the first filter 2 of the multiplexer 100. More specifically, the common terminal 80 is coupled to the second signal terminal 12 (see FIG. 1) in the high frequency module 1 forming the multiplexer 100, and is coupled to the first filter 2 via the second inductor L5 (see FIG. 1). In addition, in the first switch 8, the selection terminal 81 is coupled to the first transmitting filter 111 and the selection terminal 82 is coupled to the first receiving filter 121. The first switch 8 is controlled by the signal processing circuit 301, for example. In this case, the first switch 8 switches a connection state of the common terminal 80 with the plurality of selection terminals 81 and 82 according to a control signal from the RF signal processing circuit 302 of the signal processing circuit 301. The first switch 8 is a switch integrated circuit (IC), for example. The first switch 8 is a switch that can couple, for example, the common terminal 80 to at least one of the plurality of selection terminals 81 and 82. Here, the first switch 8 is a switch capable of one-to-one coupling and one-to-many coupling, for example.

The second switch 9 has a common terminal 90 and a plurality of (for example, two) selection terminals 91 and 92. In the second switch 9, the common terminal 90 is coupled to the second filter 3 of the multiplexer 100. More specifically, the common terminal 90 is coupled to the third signal terminal 13 (see FIG. 1) in the high frequency module 1 forming the multiplexer 100, and is coupled to the second filter 3 via the third inductor L8 (see FIG. 1). In addition, in the second switch 9, the selection terminal 91 is coupled to the second transmitting filter 112 and the selection terminal 92 is coupled to the second receiving filter 122. The second switch 9 is controlled by the signal processing circuit 301, for example. In this case, the second switch 9 switches a connection state of the common terminal 90 with the plurality of selection terminals 91 and 92 according to the control signal from the RF signal processing circuit 302 of the signal processing circuit 301. The second switch 9 is the switch IC, for example. The second switch 9 is a switch that can couple, for example, the common terminal 90 to at least one of the plurality of selection terminals 91 and 92. Here, the second switch 9 is the switch capable of the one-to-one and the one-to-many coupling, for example.

The first power amplifier 151 has an input terminal and an output terminal. The first power amplifier 151 amplifies a transmitted signal inputted to the input terminal of the first power amplifier 151 and outputs the amplified signal from the output terminal of the first power amplifier 151. The input terminal of the first power amplifier 151 is coupled to the first signal input terminal T1. The input terminal of the first power amplifier 151 is coupled to the signal processing circuit 301 via the first signal input terminal T1. The first signal input terminal T1 is a terminal for inputting a high frequency signal (transmitted signal) from an external circuit (such as the signal processing circuit 301) to the high frequency circuit 200. The output terminal of the first power amplifier 151 is coupled to the first transmitting filter 111 via the first output matching circuit 131. The first power amplifier 151 is a power amplifier capable of amplifying a high frequency signal in a pass band of the first transmitting filter 111. The first output matching circuit 131 is a circuit for impedance matching between the first power amplifier 151 and the first transmitting filter 111, and includes a plurality of inductors and a plurality of capacitors, for example.

The second power amplifier 152 has an input terminal and an output terminal. The second power amplifier 152 amplifies a transmitted signal inputted to the input terminal of the second power amplifier 152 and outputs the amplified signal from the output terminal of the second power amplifier 152. The input terminal of the second power amplifier 152 is coupled to the second signal input terminal T2. The input terminal of the second power amplifier 152 is coupled to the signal processing circuit 301 via the second signal input terminal T2. The second signal input terminal T2 is a terminal for inputting the high frequency signal (transmitted signal) from the external circuit (such as signal processing circuit 301) to the high frequency circuit 200. The output terminal of the second power amplifier 152 is coupled to the second transmitting filter 112 via the second output matching circuit 132. The second power amplifier 152 is a power amplifier capable of amplifying a high frequency signal in a pass band of the second transmitting filter 112. The second output matching circuit 132 is a circuit for impedance matching between the second power amplifier 152 and the second transmitting filter 112, and includes a plurality of inductors and a plurality of capacitors, for example.

The high frequency circuit 200 may further include a controller. The controller controls the first power amplifier 151 and the second power amplifier 152 according to, for example, the control signal from the signal processing circuit 301.

The first low-noise amplifier 161 has an input terminal and an output terminal. The first low-noise amplifier 161 amplifies a received signal inputted to the input terminal of the first low-noise amplifier 161 and outputs the amplified signal from the output terminal of the first low-noise amplifier 161. The input terminal of the first low-noise amplifier 161 is coupled to the first receiving filter 121 via the first input matching circuit 141. The first input matching circuit 141 is a circuit for the impedance matching between the first low-noise amplifier 161 and the first receiving filter 121. The first input matching circuit 141 includes an inductor, for example. The output terminal of the first low-noise amplifier 161 is coupled to the first signal output terminal T3. The output terminal of the first low-noise amplifier 161 is coupled to the signal processing circuit 301 via the first signal output terminal T3. The first signal output terminal T3 is a terminal for outputting a high frequency signal (received signal) from the first low-noise amplifier 161 to the external circuit (such as the signal processing circuit 301).

The second low-noise amplifier 162 has an input terminal and an output terminal. The second low-noise amplifier 162 amplifies a received signal inputted to the input terminal of the second low-noise amplifier 162 and outputs the amplified signal from the output terminal of the second low-noise amplifier 162. The input terminal of the second low-noise amplifier 162 is coupled to the second receiving filter 122 via the second input matching circuit 142. The second input matching circuit 142 is a circuit for the impedance matching between the second low-noise amplifier 162 and the second receiving filter 122. The second input matching circuit 142 includes an inductor, for example. The output terminal of the second low-noise amplifier 162 is coupled to the signal processing circuit 301 via the second signal output terminal T4, for example. The second signal output terminal T4 is a terminal for outputting a high frequency signal (received signal) from the second low-noise amplifier 162 to the external circuit (such as the signal processing circuit 301).

(2.2) Circuit Configuration of High Frequency Module

As illustrated in FIG. 1, the high frequency module 1 includes the first signal terminal 11, the second signal terminal 12, the third signal terminal 13, the hybrid filter 2 (the first filter 2), the second filter 3, the second inductor L5, and the third inductor L8.

The hybrid filter 2 includes the first acoustic wave filter 20, the first inductor L4, and the capacitor C2. The first acoustic wave filter 20 has the at least one (for example, five) acoustic wave resonator 24. The first acoustic wave filter 20 is, for example, a surface acoustic wave (SAW) filter that utilizes surface acoustic waves. In this case, each of the plurality of acoustic wave resonators 24 is a SAW resonator.

The first acoustic wave filter 20 is a ladder filter. The first acoustic wave filter 20 has the five acoustic wave resonators 24, a first input/output electrode coupled to the first signal terminal 11, a second input/output electrode 26 coupled to the second signal terminal 12 via at least the first inductor L4, and three ground electrodes 27, 28, and 29. The five acoustic wave resonators 24 include two series-arm resonators S21 and S22 and three parallel-arm resonators P21, P22, and P23.

The two series-arm resonators S21 and S22 are provided on a path 256 (hereinafter referred to as a series-arm path 256) between the first input/output electrode 25 and the second input/output electrode 26. The two series-arm resonators S21 and S22 are coupled in series on the series-arm path 256. In the first acoustic wave filter 20, the two series-arm resonators S21 and S22 are arranged in the order of the series-arm resonator S21 and the series-arm resonator S22 from the side of the first input/output electrode 25, on the series-arm path 256.

The parallel-arm resonator P21 is provided on a path 257 (a parallel-arm path 257) between the ground electrode 27 and a path between the series-arm resonator S21 and the series-arm resonator S22 on the series-arm path 256. The parallel-arm resonator P22 is provided on a path 258 (a parallel-arm path 258) between the ground electrode 28 and a path between the series-arm resonator S22 on the series-arm path 256 and the second input/output electrode 26. The parallel-arm resonator P23 is provided on a path 259 (a parallel-arm path 259) between the ground electrode 29 and a path between the series-arm resonator S22 on the series-arm path 256 and the second input/output electrode 26.

The hybrid filter 2 further includes an inductor L3 and an inductor L2. In the inductor L3, one end of the inductor L3 is coupled to the two ground electrodes 27 and 28 of the first acoustic wave filter 20, and the other end of the inductor L3 is coupled to the ground (the ground terminal 7) of the high frequency module 1. In the inductor L2, one end of the inductor L2 is coupled to the one ground electrode 29 of the first acoustic wave filter 20, and the other end of the inductor L2 is coupled to the ground (the ground terminal 7) of the high frequency module 1.

The first inductor L4 is coupled in series to the first acoustic wave filter 20. More specifically, in the first inductor L4, one end of the first inductor L4 is coupled to the second input/output electrode 26 of the first acoustic wave filter 20, and the other end of the first inductor L4 is coupled to the second signal terminal 12 with the second inductor L5 interposed therebetween. As a result, the first inductor L4 is coupled in series to the series-arm resonator S22. The capacitor C2 is coupled between the above-described other end of the first inductor L4 and the ground (the ground terminal 7) of the high frequency module 1. The hybrid filter 2 is a filter including the first acoustic wave filter 20 and an LC filter. The LC filter includes the first inductor L4 and the capacitor C2. The hybrid filter 2 has the wider pass band width than in a case where only the first acoustic wave filter 20 forms the hybrid filter 2. In addition, the hybrid filter 2 has improved attenuation characteristics near the pass band than a case where only the LC filter forms the hybrid filter 2. The pass band width of the hybrid filter 2 is a frequency range with insertion loss of 3 dB or less in filter characteristics.

The second inductor L5 is provided on a signal path 212 between the hybrid filter 2 and the second signal terminal 12. In other words, the second inductor L5 is coupled between the hybrid filter 2 and the second signal terminal 12. More specifically, the second inductor L5 is coupled between the second signal terminal 12 and a node between the first inductor L4 and the capacitor C2. In other words, in the second inductor L5, the one end of the second inductor L5 is coupled to the node between the first inductor L4 and the capacitor C2, and the other end of the second inductor L5 is coupled to the second signal terminal 12. The second inductor L5 is an inductor for matching the impedance of the signal path 212 coupled to the hybrid filter 2 to 50Ω. Inductance of the second inductor L5 ranges from 0.5 nH to 2 nH, for example.

The second filter 3 includes the second acoustic wave filter 30, an inductor L6, and an inductor L7. The second acoustic wave filter 30 has at least one (for example, five) acoustic wave resonator 34. The second acoustic wave filter 30 is the SAW filter that utilizes the surface acoustic waves, for example. In this case, each of the plurality of acoustic wave resonators 34 is the SAW resonator.

The second acoustic wave filter 30 is a ladder filter. The second acoustic wave filter 30 has the five acoustic wave resonators 34, a first input/output electrode 35 coupled to the first signal terminal 11, a second input/output electrode 36 coupled to the third signal terminal 13, and two ground electrodes 37 and 38. The five acoustic wave resonators 34 include three series-arm resonators S31, S32, and S33 and two parallel-arm resonators P31 and P32.

The three series-arm resonators S31, S32, and S33 are provided on a path 356 (hereinafter referred to as a series-arm path 356) between the first input/output electrode 35 and the second input/output electrode 36. The three series-arm resonators S31, S32, and S33 are coupled in series on the series-arm path 356. In the second acoustic wave filter 30, the three series-arm resonators S31, S32, and S33 are arranged in the order of the series-arm resonator S31, the series-arm resonator S32, and the series-arm resonator S33 from the side of the first input/output electrode 35, on the series-arm path 356.

The parallel-arm resonator P31 is provided on a path 357 (a parallel-arm path 357) between the ground electrode 37 and a path between the series-arm resonator S31 and the series-arm resonator S32 on the series-arm path 356. The parallel-arm resonator P32 is provided on a path 358 (a parallel-arm path 358) between the ground electrode 38 and a path between the series-arm resonator S32 and the series-arm resonator S33 on the series-arm path 356.

In the inductor L6, one end of the inductor L6 is coupled to the ground electrode 37 of the second acoustic wave filter 30, and the other end of the inductor L6 is coupled to the ground (the ground terminal 7) of the high frequency module 1. In the inductor L7, one end of the inductor L7 is coupled to the ground electrode 38 of the second acoustic wave filter 30, and the other end of the inductor L7 is coupled to the ground (the ground terminal 7) of the high frequency module 1.

The third inductor L8 is provided on a signal path 313 between the second acoustic wave filter 30 and the third signal terminal 13. In other words, the third inductor L8 is coupled between the second acoustic wave filter 30 and the third signal terminal 13. The third inductor L8 is coupled in series to the second acoustic wave filter 30. More specifically, in the third inductor L8, one end of the third inductor L8 is coupled to the second input/output electrode 36 of the second acoustic wave filter 30, and the other end of the third inductor L8 is coupled to the third signal terminal 13. As a result, the third inductor L8 is coupled in series to the series-arm resonator S33. The third inductor L8 is an inductor for the impedance matching. The inductance of the third inductor L8 ranges from 0.5 nH to 2 nH, for example.

In addition, the high frequency module 1 further includes an inductor L1 and a capacitor C1. A series circuit between the inductor L1 and the capacitor C1 is coupled between a signal path between the first signal terminal 11 and a node between the first filter 2 and the second filter 3, and the ground. The series circuit between the inductor L1 and the capacitor C1 is included in the matching circuit 10 for the impedance matching between the first and second filters 2 and 3 and the first signal terminal 11. The matching circuit 10 is coupled between the first signal terminal 11 and (the first input/output electrode 25 of) the first acoustic wave filter 20. In addition, the matching circuit 10 is coupled between the first signal terminal 11 and (the first input/output electrode 35 of) the second acoustic wave filter 30. Note that in the high frequency module 1 according to the first embodiment, the series circuit between the inductor L1 and the capacitor C1 is not limited to having a capability of the impedance matching between the first and second filters 2 and 3 and the first signal terminal 11. For example, the series circuit between the inductor L1 and the capacitor C1 also has a capability of improving the attenuation characteristics on a lower frequency side or a higher frequency side than a pass band of the first filter 2 and a pass band of the second filter 3, in addition to the capability of the impedance matching.

(2.3) Structure of High Frequency Module

Figure 4:
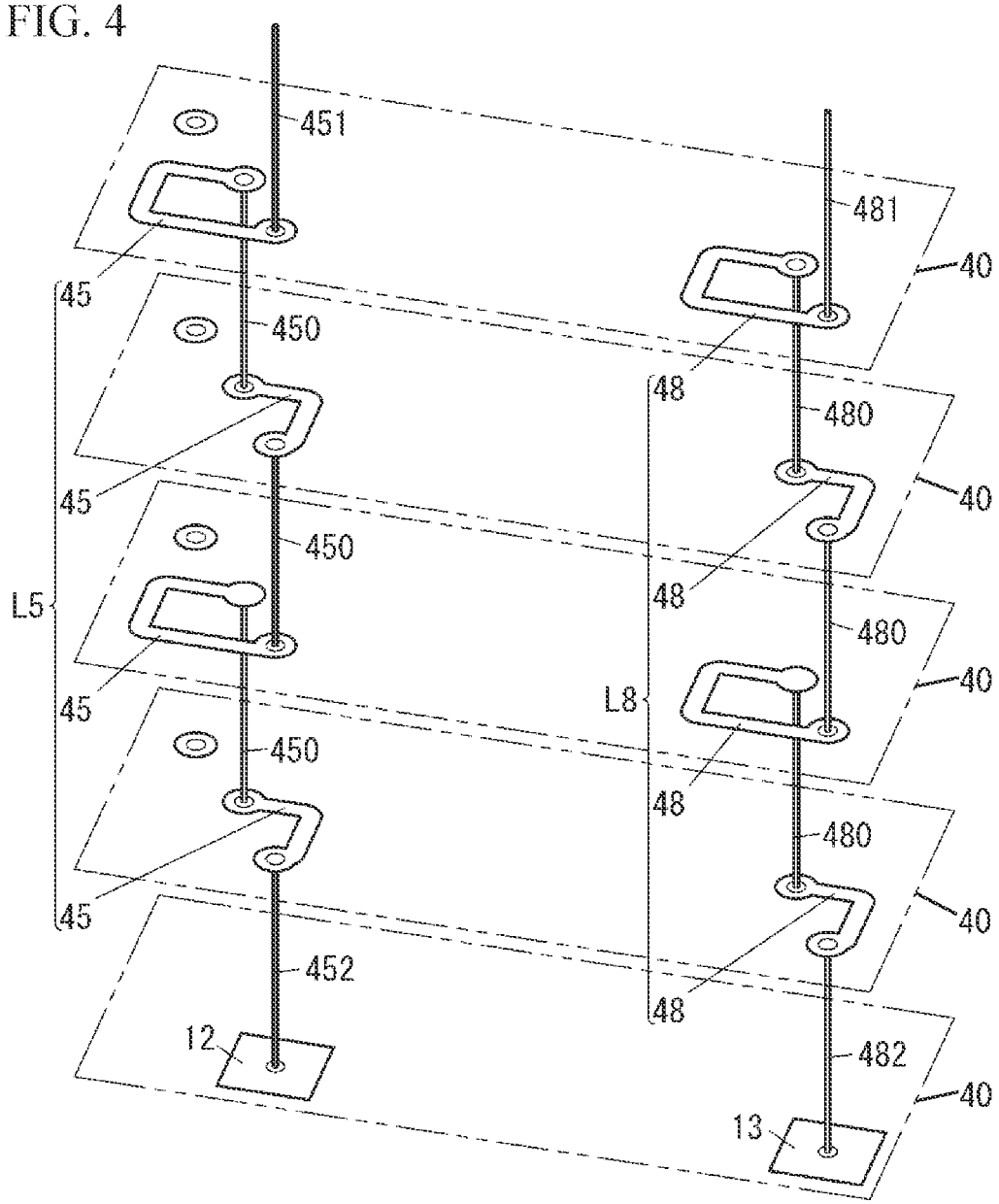
FIG. 4 is a perspective view of a second inductor and a third inductor in the high frequency module of the first embodiment.

A structure of the high frequency module 1 is described hereinafter with reference to FIGS. 2 to 4.

The high frequency module 1 includes the mounting substrate 4, the first signal terminal 11 (see FIG. 1), the second signal terminal 12, the third signal terminal 13, the plurality of ground terminals 7, the first acoustic wave filter 20, the first inductor L4, the capacitor C2, the second inductor L5, the second acoustic wave filter 30, and the third inductor L8. The high frequency module 1 also includes the inductor L1, the inductor L2, the inductor L3, the inductor L6, the inductor L7, and the capacitor C1. In addition, the high frequency module 1 includes the resin layer 5 and the metal electrode layer 6.

The mounting substrate 4 has the first principal surface 41 and the second principal surface 42 that are opposed to each other in a thickness direction D1 of the mounting substrate 4. The mounting substrate 4 is a multilayer substrate including a plurality of dielectric layers and a plurality of conductor layers. The plurality of dielectric layers and the plurality of conductor layers are laminated in the thickness direction D1 of the mounting substrate 4. The plurality of conductor layers are formed in a predetermined pattern defined for each layer. Each of the plurality of conductor layers includes one or more conductor parts in a plane orthogonal to the thickness direction D1 of the mounting substrate 4. Each conductor layer is made of copper, for example. The plurality of conductor layers includes a ground layer 491. In the high frequency module 1, the plurality of ground terminals 7 and the ground layer 491 are electrically coupled to each other with via conductors 490 or the like in the mounting substrate 4 interposed therebetween. The mounting substrate 4 is a Low Temperature Co-fired Ceramics (LTCC) substrate, for example. The mounting substrate 4 is not limited to the LTCC substrate, and may be, for example, a printed wiring board, a High Temperature Co-fired Ceramics (HTCC) substrate, or a resin multilayer substrate. An outer edge of the mounting substrate 4 is a quadrangular shape in plan view from the thickness direction D1 of the mounting substrate 4.

In addition, the mounting substrate 4 is not limited to the LTCC substrate and may be a wiring structure, for example. The wiring structure is a multilayer structure, for example. The multilayer structure includes at least one insulating layer and at least one conductive layer. The insulating layer is formed in a predetermined pattern. When there is a plurality of insulating layers, the plurality of insulating layers are formed in a predetermined pattern defined for each layer. The conductive layer is formed in a predetermined pattern that is different from the predetermined pattern of the insulating layer. When there is a plurality of conductive layers, the plurality of conductive layers are formed in a predetermined pattern defined for each layer. The conductive layer may include one or more re-wiring parts. In the wiring structure, a first surface of two surfaces facing each other in a thickness direction of the multilayer structure is the first principal surface 41 of the mounting substrate 4, and a second surface is the second principal surface 42 of the mounting substrate 4. The wiring structure may be an interposer, for example. The interposer may be an interposer using a silicon substrate or a may be a multilayered substrate.

The first principal surface 41 and the second principal surface 42 of the mounting substrate 4 are separated from each other in the thickness direction D1 of the mounting substrate 4 and intersect the thickness direction D1 of the mounting substrate 4. The first principal surface 41 in the mounting substrate 4 is orthogonal to the thickness direction D1 of the mounting substrate 4, for example, but may include, for example, a side surface of the conductor part as a surface that is not orthogonal to the thickness direction D1. In addition, the second principal surface 42 in the mounting substrate 4 is orthogonal to the thickness direction D1 of the mounting substrate 4, for example, but may include, for example, a side surface of the conductor part as a surface that is not orthogonal to the thickness direction D1. In addition, the first principal surface 41 and the second principal surface 42 of the mounting substrate 4 may have fine irregularities or recesses or protrusions formed thereon.

The plurality of external connection terminals included in the high frequency module 1 are disposed on the second principal surface 42 of the mounting substrate 4. "The external connection terminals are disposed on the second principal surface 42 of the mounting substrate 4" includes the external connection terminals being mechanically coupled to the second principal surface 42 of the mounting substrate 4 and the external connection terminals being electrically coupled to (a suitable conductor part of) the mounting substrate 4. The plurality of external connection terminals include the first signal terminal 11, the second signal terminal 12, the third signal terminal 13, and the plurality of the ground terminals 7. The plurality of ground terminals 7 are electrically coupled to the ground layer 491 of the mounting substrate 4. The ground layer 491 is a circuit ground for the high frequency module 1. Each of the first signal terminal 11, the second signal terminal 12, the third signal terminal 13, and the plurality of ground terminals 7 is a quadrangular shape in plan view from the thickness direction D1 of the mounting substrate 4, but is not limited thereto and may be a circular shape, for example. The first signal terminal 11, the second signal terminal 12, the third signal terminal 13, and the plurality of ground terminals 7 each has a thickness thinner than that of the mounting substrate 4. The plurality of external connection terminals are made of a metal (such as copper, a copper alloy, or the like), for example.

In the high frequency module 1, a plurality of electronic components are mounted on the first principal surface 41 of the mounting substrate 4. The plurality of electronic components include the first acoustic wave filter 20, the second acoustic wave filter 30, the first inductor L4, the capacitor C2, the inductor L1, and the capacitor C1. "The electronic components are mounted on the first principal surface 41 of the mounting substrate 4" includes the electronic components being disposed on (being mechanically coupled to) the first principal surface 41 of the mounting substrate 4 and the electronic components being electrically coupled to (the suitable conductor part of) the mounting substrate 4.

The first acoustic wave filter 20 is mounted on the first principal surface 41 of the mounting substrate 4. An outer edge 210 of the first acoustic wave filter 20 is a quadrangular shape in plan view from the thickness direction D1 of the mounting substrate 4. The first acoustic wave filter 20 includes, for example, a first substrate and a plurality of first interdigital transducer (IDT) electrodes provided on the first substrate. The first substrate is a piezoelectric substrate such as a lithium tantalate substrate or a lithium niobate substrate. The plurality of first IDT electrodes are conductive. The plurality of first IDT electrodes are made of, for example, Al (aluminum), Cu (copper), Pt (platinum), Au (gold), Ag (silver), Ti (titanium), Ni (nickel), Cr (chromium), Mo (molybdenum), W (tungsten), Ta (tantalum), Mg (magnesium), Fe (iron) or an alloy or the like whose main component is any of these metals. In the first acoustic wave filter 20, each of the plurality of first IDT electrodes is a constituent part of the acoustic wave resonator 24 (the SAW resonator). The first acoustic wave filter 20 is mounted on the first principal surface 41 of the mounting substrate 4 so that the plurality of first IDT electrodes are located on the side of the mounting substrate 4 when viewed from the first substrate, for example. The first acoustic wave filter 20 further includes a constituent part of a first package. The constituent part of the first package includes a first spacer layer, a first cover member, and a plurality of first external terminals (the first input/output electrode 25, the second input/output electrode 26, and the three ground electrodes 27, 28, and 29). The first spacer layer is provided on the first substrate. In plan view from a thickness direction of the first substrate, the first spacer layer has a portion shaped like a rectangular frame formed along the outer edge of the first substrate. The first spacer layer is an electrically insulating layer. The first spacer layer is made of epoxy resin, polyimide, or the like. The first cover member is shaped like a flat plate. The first cover member is disposed on the first spacer layer so as to face the first substrate in the thickness direction of the first substrate. The first cover member overlaps the plurality of first IDT electrodes in the thickness direction of the first substrate, and is separated from the plurality of first IDT electrodes in the thickness direction of the first substrate. The first cover member is an electrically insulating member. The first cover member is made of epoxy resin, polyimide, or the like. The plurality of first external terminals are exposed from the first cover member. Note that the first acoustic wave filter 20 may be an acoustic wave filter of a bare chip (also referred to as a bare die).

The second acoustic wave filter 30 is mounted on the first principal surface 41 of the mounting substrate 4. An outer edge of the second acoustic wave filter 30 is a quadrangular shape in plan view from the thickness direction D1 of the mounting substrate 4. The second acoustic wave filter 30 includes, for example, a second substrate and a plurality of second IDT electrodes provided on the second substrate. The second substrate is the piezoelectric substrate such as the lithium tantalate substrate or the lithium niobate substrate. The plurality of second IDT electrodes are conductive. The plurality of second IDT electrodes are made of, for example, Al, Cu, Pt, Au, Ag, Ti, Ni, Cr, Mo, W, Ta, Mg, Fe or an alloy or the like whose main component is any of these metals. In the second acoustic wave filter 30, each of the plurality of second IDT electrodes is a constituent part of the acoustic wave resonator 34 (the SAW resonator). The second acoustic wave filter 30 is mounted on the first principal surface 41 of the mounting substrate 4 so that the plurality of second IDT electrodes are located on the side of the mounting substrate 4 when viewed from the second substrate, for example. The second acoustic wave filter 30 further includes a constituent part of a second package. The constituent part of the second package includes a second spacer layer, a second cover member, and a plurality of second external terminals (the first input/output electrode 35, the second input/output electrode 36, and the two ground electrodes 37 and 38), for example. The second spacer layer is provided on the second substrate. In plan view from a thickness direction of the second substrate, the second spacer layer has a portion shaped like a rectangular frame formed along the outer edge of the second substrate. The second spacer layer is an electrically insulating layer. The second spacer layer is made of epoxy resin, polyimide, or the like. The second cover member is shaped like the flat plate. The second cover member is disposed on the second spacer layer so as to face the second substrate in the thickness direction of the second substrate. The second cover member overlaps the plurality of second IDT electrodes in the thickness direction of the second substrate, and is separated from the plurality of second IDT electrodes in the thickness direction of the second substrate. The second cover member is an electrically insulating member. The second cover member is made of epoxy resin, polyimide, or the like. The plurality of second external terminals are exposed from the second cover member. Note that the second acoustic wave filter 30 may be the acoustic wave filter of the bare chip (also referred to as the bare die).

Each of the above-described first substrate and second substrate is not limited to the piezoelectric substrate, and may be a laminated substrate that includes, for example, the silicon substrate, a low acoustic velocity film provided on the silicon substrate, and a piezoelectric layer provided on the low acoustic velocity film. The piezoelectric layer is made of lithium niobate or lithium tantalate, for example. The low acoustic velocity film is a film in which an acoustic velocity of a bulk wave propagating through the piezoelectric layer is slower than the acoustic velocity of a bulk wave propagating through the low acoustic velocity film. A material of the low acoustic velocity film is silicon oxide, for example. The material of the low acoustic velocity film is not limited to silicon oxide. The material of the low acoustic velocity film may be, for example, silicon oxide, glass, silicon oxynitride, tantalum oxide, a compound obtained by adding fluorine, carbon, or boron to silicon oxide, or a material whose main component is each of the above materials. In the silicon substrate, an acoustic velocity of a bulk wave propagating the silicon substrate is faster than the acoustic velocity of the acoustic wave propagating through the piezoelectric layer. Here, the bulk wave propagating the silicon substrate is the bulk wave having the lowest acoustic velocity among a plurality of bulk waves propagating the silicon substrate.

The laminated substrate may further have a high acoustic velocity film provided between the silicon substrate and the low acoustic velocity film. The high acoustic velocity film is a film in which the acoustic velocity of the bulk wave propagating through the high acoustic velocity film is higher than the acoustic velocity of an acoustic wave propagating through the piezoelectric layer. A material of the high acoustic velocity film is at least one material selected from the group consisting of, for example, diamond-like carbon, aluminum nitride, aluminum oxide, silicon carbide, silicon nitride, silicon, sapphire, a piezoelectric material (lithium tantalate, lithium niobate, or crystal), alumina, zirconia, cordierite, mullite, steatite, forsterite, magnesia, and diamond. The material of the high acoustic velocity film may be a material containing any of the materials described above as a main component, or may be a material containing, as a main component, a mixture containing any of the materials described above.

In addition, the laminated substrate may include, for example, an adhesion layer interposed between the low acoustic velocity film and the piezoelectric layer. The adhesion layer is composed of, for example, resin (epoxy resin or polyimide resin). In addition, the laminated substrate may include a dielectric film disposed between the low acoustic velocity film and the piezoelectric layer, on the piezoelectric layer, or under the low acoustic velocity film.

The first inductor L4 is mounted on the first principal surface 41 of the mounting substrate 4. The first inductor L4 is a chip inductor, for example. An outer edge of the first inductor L4 is a substantially rectangular shape in plan view from the thickness direction D1 of the mounting substrate 4.

The capacitor C2 is mounted on the first principal surface 41 of the mounting substrate 4. The capacitor C2 is a chip capacitor, for example. An outer edge of the capacitor C2 is a substantially rectangular shape in plan view from the thickness direction D1 of the mounting substrate 4.

The inductor L1 is mounted on the first principal surface 41 of the mounting substrate 4. The inductor L1 is a chip inductor, for example. An outer edge of the inductor L1 is a substantially rectangular shape in plan view from the thickness direction D1 of the mounting substrate 4.

The capacitor C1 is mounted on the first principal surface 41 of the mounting substrate 4. The capacitor C1 is a chip capacitor, for example. An outer edge of the capacitor C1 is a substantially rectangular shape in plan view from the thickness direction D1 of the mounting substrate 4.

The second inductor L5 is an inductor including conductor pattern parts 45 (see FIGS. 3 and 4) formed in the mounting substrate 4. Here, the second inductor L5 is a spiral-like inductor that has a winding shaft along the thickness direction D1 of the mounting substrate 4 and includes a plurality of (for example, four) conductor pattern parts 45 and a plurality of (for example, three) via conductors 450, as illustrated in FIG. 4, for example. In the second inductor L5, the plurality of conductor pattern parts 45 and the plurality of via conductors 450 are alternately arranged one by one in the thickness direction D1 of the mounting substrate 4. One end of one of the two conductor pattern parts 45, which are adjacent to each other in the thickness direction D1, is coupled to one end of the other of the two conductor pattern parts 45 with the one via conductor 450 interposed therebetween. In addition, the one end of the second inductor L5 is coupled to the via conductor 451 forming part of a path between the second inductor L5 and the first filter 2 in the signal path 212 (see FIG. 1). In addition, the other end of the second inductor L5 is coupled to the second signal terminal 12 with the via conductor 452 interposed therebetween, the via conductor 452 forming a path between the second inductor L5 and the second signal terminal 12 in the signal path 212. In the second inductor L5, the plurality of conductor pattern parts 45 and the plurality of via conductors 450 are alternately arranged one by one in the thickness direction D1 of the mounting substrate 4. The one end of the one of the two conductor pattern parts 45, which are adjacent to each other in the thickness direction D1, is coupled to the one end of the other of the two conductor pattern parts 45 with the one via conductor 450 interposed therebetween. In addition, the one end of the second inductor L5 is coupled to the via conductor 451 forming part of the signal path 212. In addition, the other end of the second inductor L5 is coupled to the second signal terminal 12 with the via conductor 452 interposed therebetween, the via conductor 452 forming another part of the signal path 212. The second inductor L5 is, for example, a rectangular frame shape in plan view from the thickness direction D1 of the mounting substrate 4, but is not limited to the rectangular frame shape. Note that in FIG. 4, principal surfaces 40 of the plurality of dielectric layers where the plurality of conductor pattern parts 45 are formed in the mounting substrate 4 are depicted by two-dot chain lines.

The third inductor L8 is an inductor including conductor pattern parts 48 formed in the mounting substrate 4. Here, the third inductor L8 is a spiral-like inductor that has the winding shaft along the thickness direction D1 of the mounting substrate 4 and includes a plurality of (for example, four) conductor pattern parts 48 and a plurality of (for example, three) via conductors 480, as illustrated in FIG. 4, for example. In the third inductor L8, the plurality of conductor pattern parts 48 and the plurality of via conductors 480 are alternately arranged one by one in the thickness direction D1 of the mounting substrate 4. One end of one of the two conductor pattern parts 48, which are adjacent to each other in the thickness direction D1, is coupled to one end of the other of the two conductor pattern parts 48 with the one via conductor 480 interposed therebetween. In addition, the one end of the third inductor L8 is coupled to the via conductor 481 forming part of a path between the third inductor L8 and the second filter 3 in the signal path 313 (see FIG. 1). In addition, the other end of the third inductor L8 is coupled to the third signal terminal 13 with the via conductor 482 interposed therebetween, the via conductor 482 forming a path between the third inductor L8 and the third signal terminal 13 in the signal path 313. Note that in FIG. 4, the principal surfaces 40 of the plurality of dielectric layers where the plurality of conductor pattern parts 48 are formed in the mounting substrate 4 are depicted by the two-dot chain lines.

The inductor L2, the inductor L3, the inductor L6, and the inductor L7 include the conductor pattern parts formed in the mounting substrate 4, similarly to the second inductor L5 and the third inductor L8. Here, the inductor L2, the inductor L3, the inductor L6, and the inductor L7 are each a spiral-like inductor that has the winding shaft along the thickness direction D1 of the mounting substrate 4 and includes, for example, the plurality of conductor pattern parts and the plurality of (for example, three) via conductors.

As illustrated in FIG. 3, the resin layer 5 is disposed on the first principal surface 41 of the mounting substrate 4. The resin layer 5 includes resin (such as epoxy resin). The resin layer 5 may include a filler in addition to the resin.

The resin layer 5 covers the first inductor L4, the capacitor C2, and the outer peripheral surface of the first acoustic wave filter 20. The outer peripheral surface of the first acoustic wave filter 20 includes four side surfaces connecting a principal surface of the first acoustic wave filter 20 on the side opposite to the mounting substrate 4 side and a principal surface on the mounting substrate 4 side. The outer peripheral surface of the first acoustic wave filter 20 does not include the principal surface of the first acoustic wave filter 20 on the side opposite to the mounting substrate 4 side and the principal surface of the first acoustic wave filter 20 on the mounting substrate 4 side. In the high frequency module 1 according to the first embodiment, the resin layer 5 also covers the principal surface of the first acoustic wave filter 20 on the side opposite to the mounting substrate 4 side. In addition, the resin layer 5 covers an outer peripheral surface of the first inductor L4 and a principal surface of the first inductor L4 on the side opposite to the mounting substrate 4 side. The resin layer 5 also covers an outer peripheral surface of the capacitor C2 and the principal surface of the capacitor C2 on the side opposite to the mounting substrate 4 side.

In addition, the resin layer 5 covers the inductor L1, the capacitor C1, and the outer peripheral surface of the second acoustic wave filter 30. The outer peripheral surface of the second acoustic wave filter 30 includes four side surfaces connecting a principal surface of the second acoustic wave filter 30 on the side opposite to the mounting substrate 4 side and a principal surface on the mounting substrate 4 side. In the high frequency module 1 according to the first embodiment, the resin layer 5 also covers the principal surface of the second acoustic wave filter 30 on the side opposite to the mounting substrate 4 side. In addition, the resin layer 5 covers an outer peripheral surface of the inductor L1 and a principal surface of the inductor L1 on the side opposite to the mounting substrate 4 side. The resin layer 5 also covers an outer peripheral surface of the capacitor C1 and the principal surface of the capacitor C1 on the side opposite to the mounting substrate 4 side.

The metal electrode layer 6 covers the resin layer 5 and is coupled to the ground terminals 7. The metal electrode layer 6 is conductive. In the high frequency module 1, the metal electrode layer 6 is a shield layer provided for electromagnetic shielding inside and outside of the high frequency module 1. The metal electrode layer 6 has a multilayered structure in which a plurality of metal layers are laminated, but is not limited thereto and may be one metal layer. The metal layer includes one or more metals. When the metal electrode layer 6 has the multilayered structure in which the plurality of metal layers are laminated, for example, the metal electrode layer 6 includes a first stainless steel layer, a Cu layer on the first stainless steel layer, and a second stainless steel layer on the Cu layer. A material of each of the first stainless steel layer and the second stainless steel layer is an alloy containing Fe, Ni, and Cr. In addition, the metal electrode layer 6 is, for example, the Cu layer in the case of one metal layer. The metal electrode layer 6 includes a first conductor part 61 and a second conductor part 62. The first conductor part 61 covers a principal surface 51 of the resin layer 5 on the side opposite to the mounting substrate 4 side. The second conductor part 62 covers an outer peripheral surface 53 of the resin layer 5 and an outer peripheral surface 43 of the mounting substrate 4. The metal electrode layer 6 is in contact with at least part of an outer peripheral surface of the ground layer 491 of the mounting substrate 4. This allows the high frequency module 1 to make a potential of the metal electrode layer 6 the same as that of the ground layer 491 of the mounting substrate 4.

(2.4) Layout of High Frequency Module

In the high frequency module 1, as described above, among the plurality of components of the hybrid filter 2, the first acoustic wave filter 20, the first inductor L4, and the capacitor C2 are mounted on the first principal surface 41 of the mounting substrate 4, and the second inductor L5, the inductor L2, and the inductor L3 are disposed in the mounting substrate 4. In addition, in the high frequency module 1, among the plurality of components of the second filter 3, the second acoustic wave filter 30 is mounted on the first principal surface 41 of the mounting substrate 4, and the inductor L6 and the inductor L7 are disposed in the mounting substrate 4. Further, in the high frequency module 1, the third inductor L8 is disposed in the mounting substrate 4. In addition, in the high frequency module 1, among the plurality of components of the matching circuit 10, the inductor L1 and the capacitor C1 are mounted on the first principal surface 41 of the mounting substrate 4. In addition, in the high frequency module 1, the first signal terminal 11, the second signal terminal 12, the third signal terminal 13, and the plurality of ground terminals 7 are disposed on the second principal surface 42 of the mounting substrate 4. The metal electrode layer 6 is coupled to the plurality of ground terminals 7 with the ground layer 491 in the mounting substrate 4 interposed therebetween.

In the high frequency module 1, the inductor L2 and the inductor L3 overlap the first acoustic wave filter 20 in plan view from the thickness direction D1 of the mounting substrate 4. In the high frequency module 1, part of each of the inductor L2 and the inductor L3 overlaps the first acoustic wave filter 20 in plan view from the thickness direction D1 of the mounting substrate 4, but the present embodiment is not limited thereto. For example, in plan view from the thickness direction D1 of the mounting substrate 4, part of one of the inductor L2 and the inductor L3 and the entirety of the other may overlap the first acoustic wave filter 20, or the entirety of each of the inductor L2 and the inductor L3 may overlap the first acoustic wave filter 20. In the high frequency module 1, in plan view from the thickness direction D1 of the mounting substrate 4, the inductor L2 and the inductor L3 overlap at least one of the plurality of ground terminals 7.

In the high frequency module 1, the first inductor L4 coupled to the second input/output electrode 26 (see FIG. 1) of the first acoustic wave filter 20 is adjacent to the first acoustic wave filter 20 on the first principal surface 41 of the mounting substrate 4. "The first inductor L4 is adjacent to the first acoustic wave filter 20" means that the first inductor L4 and the first acoustic wave filter 20 are adjacent to each other on the first principal surface 41 of the mounting substrate 4 with no other electronic component between the first inductor L4 and the first acoustic wave filter 20.

In the high frequency module 1, in plan view from the thickness direction D1 of the mounting substrate 4, the second inductor L5 coupled between the second signal terminal 12 and the node between the first inductor L4 and the capacitor C2 does not overlap the first acoustic wave filter 20, but is located beside the first inductor L4. In addition, the second inductor L5 overlaps the second signal terminal 12 in plan view from the thickness direction D1 of the mounting substrate 4. In the high frequency module 1, in plan view from the thickness direction D1 of the mounting substrate 4, part of the second inductor L5 overlaps part of the second signal terminal 12, but the present embodiment is not limited thereto. The entire inductor L5 may overlap the entire second signal terminal 12 or part of the second signal terminal 12 may overlap the entire second inductor L5.

In the hybrid filter 2, among the acoustic wave filter 20, the first inductor L4, and the capacitor C2, the first inductor L4 is located at a position closest to the metal electrode layer 6. In other words, the shortest distance between the first inductor L4 and the metal electrode layer 6 is shorter than the shortest distance between the acoustic wave filter 20 and the metal electrode layer 6 and the shortest distance between the capacitor C2 and the metal electrode layer 6. Here, the shortest distance between the first inductor L4 and the first conductor part 61 of the metal electrode layer 6 is shorter than the shortest distance between the first inductor L4 and the second conductor part 62 of the metal electrode layer 6.

In the high frequency module 1, in plan view from the thickness direction D1 of the mounting substrate 4, the inductor L6 and the inductor L7 overlap the second acoustic wave filter 30. In the high frequency module 1, in plan view from the thickness direction D1 of the mounting substrate 4, part of each of the inductor L6 and the inductor L7 overlaps the second acoustic wave filter 30, but the present embodiment is not limited thereto. For example, in plan view from the thickness direction D1 of the mounting substrate 4, part of one of the inductor L6 and the inductor L7 and the entirety of the other may overlap the second acoustic wave filter 30, or both the entire inductor L6 and the entire inductor L7 may overlap the second acoustic wave filter 30. In the high frequency module 1, in plan view from the thickness direction D1 of the mounting substrate 4, each of the inductor L6 and the inductor L7 overlaps the at least one of the plurality of ground terminals 7.

In the high frequency module 1, the third inductor L8 coupled between the second input/output electrode 36 (see FIG. 1) of the second acoustic wave filter 30 and the third signal terminal 13 does not overlap the second acoustic wave filter 30 in plan view from the thickness direction D1 of the mounting substrate 4, and is located beside the second acoustic wave filter 30. In addition, the third inductor L8 overlaps the third signal terminal 13 in plan view from the thickness direction D1 of the mounting substrate 4. In the high frequency module 1, in plan view from the thickness direction D1 of the mounting substrate 4, part of the third inductor L8 overlaps part of the third signal terminal 13, but the present embodiment is not limited thereto. The entire third inductor L8 may overlap the entire third signal terminal 13 or part of the third signal terminal 13 may overlap the entire third inductor L8. The mounting substrate 4 has a conductor part 49 coupled to the ground terminals 7. In plan view from the thickness direction D1 of the mounting substrate 4, the conductor part 49 is disposed between the second inductor L5 and the third inductor L8. "The conductor part 49 is disposed between the second inductor L5 and the third inductor L8 in plan view from the thickness direction D1 of the mounting substrate 4" means that at least one line segment of a group of line segments each connecting any point of the second inductor L5 and any point of the third inductor L8 in plan view passes through a region of the conductor part 49. "In plan view from the thickness direction D1 of the mounting substrate 4" means that the mounting substrate 4 and circuit elements (here, the second inductor L5 and the third inductor L8) disposed on the mounting substrate 4 are orthographically projected and viewed on a plane parallel to the first principal surface 41 of the mounting substrate 4. The conductor part 49 includes the ground layer 491. The ground layer 491 is disposed between the first principal surface 41 and the second principal surface 42 of the mounting substrate 4 and intersects the thickness direction D1 of the mounting substrate 4. "The ground layer 491 is disposed between the first principal surface 41 and the second principal surface 42 of the mounting substrate 4" means that at least one line segment of a group of line segments each connecting any point of the first principal surface 41 and any point of the second principal surface 42 in side view of the mounting substrate 4 passes through a region of the ground layer 491.

In the high frequency module 1, the inductor L1 overlaps the first signal terminal 11 (see FIG. 1) in plan view from the thickness direction D1 of the mounting substrate 4. In the high frequency module 1, the inductor L1 overlaps part of the first signal terminal 11 in plan view from the thickness direction D1 of the mounting substrate 4, but may overlap the entire first signal terminal 11. In addition, in the high frequency module 1, the capacitor C1 overlaps the at least one of the plurality of ground terminals 7 in plan view from the thickness direction D1 of the mounting substrate 4.

In the high frequency module 1, the matching circuit 10 has the two electronic components (the inductor L1 and the capacitor C1) mounted on the first principal surface 41 of the mounting substrate 4. In addition, in the high frequency module 1, the two circuit elements (the first inductor L4 and the capacitor C2) of the hybrid filter 2 are mounted on the first principal surface 41 of the mounting substrate 4. In the high frequency module 1, in plan view from the thickness direction D1 of the mounting substrate 4, the acoustic wave filter 20 is disposed between the two circuit elements (the first inductor L4 and the capacitor C2) of the hybrid filter 2 and the two electronic components (the inductor L1 and the capacitor C1) of the matching circuit 10. "In plan view from the thickness direction D1 of the mounting substrate 4, the acoustic wave filter 20 is disposed between the circuit elements and the electronic components" means that at least one line segment of a group of line segments each connecting any point of the circuit element and any point of the electronic component in plan view passes through a region of the acoustic wave filter 20.

In plan view from the thickness direction D1 of the mounting substrate 4, the outer edge 210 of the acoustic wave filter 20 includes a first side 201 and a second side 202 that are opposed to each other in a first direction D11. In plan view from the thickness direction D1 of the mounting substrate 4, the outer edge 210 of the acoustic wave filter includes a third side 203 and a fourth side 204 that are opposed to each other in a second direction D12 orthogonal to the first direction D11.

In plan view from the thickness direction D1 of the mounting substrate 4, the two electronic components (the inductor L1 and the capacitor C1) of the matching circuit 10 are disposed along the first side 201 of the outer edge 210 of the acoustic wave filter 20, for example. The two electronic components (the inductor L1 and the capacitor C1) of the matching circuit 10 are side by side in a direction along the first side 201 of the outer edge 210 of the acoustic wave filter 20. In plan view from the thickness direction D1 of the mounting substrate 4, the two electronic components (the inductor L1 and the capacitor C1) of the matching circuit 10 are adjacent to the first side 201 of the outer edge 210 of the acoustic wave filter 20. "The electronic components are adjacent to the first side 201 of the acoustic wave filter 20" means that the electronic components are separated from the first side 201 of the outer edge 210 of the acoustic wave filter 20, and that on the first principal surface 41 of the mounting substrate 4, the electronic component and the first side 201 of the acoustic wave filter 20 are adjacent to each other with no other electronic component between the electronic component and the first side 201 of the acoustic wave filter 20.

In plan view from the thickness direction D1 of the mounting substrate 4, the two circuit elements (the first inductor L4 and the capacitor C2) of the hybrid filter 2 are disposed along the second side 202 of the outer edge 210 of the acoustic wave filter 20. The two circuit elements (the first inductor L4 and the capacitor C2) of the hybrid filter 2 are side by side in a direction along the second side 202 of the outer edge 210 of the acoustic wave filter 20. In plan view from the thickness direction D1 of the mounting substrate 4, the two circuit elements (the first inductor L4 and the capacitor C2) of the hybrid filter 2 are adjacent to the second side 202 of the outer edge 210 of the acoustic wave filter 20. "The circuit elements are adjacent to the second side 202 of the acoustic wave filter 20" means that the circuit elements are separated from the second side 202 of the outer edge 210 of the acoustic wave filter 20, and that on the first principal surface 41 of the mounting substrate 4, the circuit elements and the second side 202 of the acoustic wave filter 20 are adjacent to each other with no other electronic component between the electronic components forming the circuit elements and the second side 202 of the acoustic wave filter 20.

(3) Effects (3.1) High Frequency Module

The high frequency module 1 according to the first embodiment includes the mounting substrate 4; the first signal terminal 11, the second signal terminal 12, and the ground terminals 7; and the hybrid filter 2. The mounting substrate 4 has the first principal surface 41 and the second principal surface 42 that are opposed to each other. The first signal terminal 11, the second signal terminal 12, and the ground terminals 7 are disposed on the mounting substrate 4. The hybrid filter 2 is coupled between the first signal terminal 11 and the second signal terminal 12. The hybrid filter 2 includes the acoustic wave filter 20 having the at least one acoustic wave resonator 24, the first inductor L4, and the capacitor C2. The pass band width of the hybrid filter 2 is larger than that of the acoustic wave resonator 24. The acoustic wave filter 20, the first inductor L4, and the capacitor C2 are mounted on the first principal surface 41 of the mounting substrate 4. The high frequency module 1 further includes the resin layer the metal electrode layer 6, and the second inductor L5. The resin layer 5 is disposed on the first principal surface 41 of the mounting substrate 4. The resin layer 5 covers the first inductor L4, the capacitor C2, and the outer peripheral surface of the acoustic wave filter 20. The metal electrode layer 6 covers at least part of the resin layer 5, and is coupled to the ground terminals 7. The second inductor L5 is disposed in or on the mounting substrate 4. The second inductor L5 is coupled between the hybrid filter 2 and the second signal terminal 12.

In the high frequency module 1 according to the first embodiment, it is possible to suppress the degradation of characteristics. More specifically, in the high frequency module 1, it is possible to suppress the degradation of the filter characteristics of the hybrid filter 2. The hybrid filter 2 is designed so that the impedance of the hybrid filter 2 in the pass band of the hybrid filter 2 is near the characteristic impedance (such as 50Ω), for example. However, when the high frequency module 1 is configured to include the metal electrode layer 6, if the second inductor L5 is not provided on the signal path 212 between the hybrid filter 2 and the second signal terminal 12, for example, the characteristics of the hybrid filter 2 degrade due to influence of a parasitic capacitance generated between the components of the hybrid filter 2 (the acoustic wave filter 20, the first inductor L4, and the capacitor C2) and the metal electrode layer 6 at the ground potential. For example, when the high frequency module 1 does not include the second inductor L5, the impedance at the second signal terminal 12 in the pass band of the hybrid filter 2 shifts from a position of the characteristic impedance on a Smith chart, so that capacitive reactance becomes large, and the characteristics degrade. In contrast to this, since the high frequency module 1 according to the first embodiment includes the second inductor L5, the impedance on the second signal terminal 12 side in the pass band of the hybrid filter 2 when viewed from the first signal terminal 11 can be brought close to the characteristic impedance. Therefore, in the high frequency module 1 according to the first embodiment, it is possible to suppress the degradation of the filter characteristics of the hybrid filter 2.

In addition, in the hybrid filter 2 in the high frequency module 1 according to the first embodiment, the shortest distance between the first inductor L1 and the metal electrode layer 6 is shorter than the shortest distance between the acoustic wave filter 20 and the metal electrode layer 6 and the shortest distance between the capacitor C2 and the metal electrode layer 6. In the high frequency module 1, the shortest distance between the first inductor L1 and the first conductor part 61 of the metal electrode layer 6 is shorter than the shortest distance between the first inductor L1 and the second conductor part 62 of the metal electrode layer 6. Since the high frequency module 1 includes the second inductor L5, it is possible to suppress the degradation of the characteristics of the hybrid filter 2 due to the influence of the parasitic capacitance generated between the first inductor L4 and the metal electrode layer 6.

In addition, since the high frequency module 1 according to the first embodiment includes the third inductor L8 coupled between the second acoustic wave filter 30 and the third signal terminal 13, it is possible to suppress the degradation of the characteristics of the second filter 3 due to, for example, the influence of the parasitic capacitance generated between the metal electrode layer 6 and the second filter 3, the parasitic capacitance generated between the signal path 313 and the metal electrode layer 6, or the like.

In addition, in the high frequency module 1 according to the first embodiment, in plan view from the thickness direction D1 of the mounting substrate 4, the acoustic wave filter 20 is disposed between the two circuit elements (the first inductor L4 and the capacitor C2) of the hybrid filter 2 and the two electronic components (the inductor L1 and the capacitor C1) of the matching circuit 10. This allows the high frequency module 1 according to the first embodiment to improve isolation between the two circuit elements (the first inductor L4 and the capacitor C2) of the hybrid filter 2 and the two electronic components (the inductor L1 and the capacitor C1) of the matching circuit 10. That is, the high frequency module 1 according to the first embodiment can suppress coupling (for example, electromagnetic coupling or capacitive coupling) between the electronic components (the inductor L1 and the capacitor C1) included in the matching circuit 10 coupled to the first input/output electrode 25 of the acoustic wave filter 20 with the circuit elements (the first inductor L4 and the capacitor C2) coupled to the second input/output electrode 26 of the acoustic wave filter 20.

In addition, in the high frequency module 1, in plan view from the thickness direction D1 of the mounting substrate 4, the two electronic components (the inductor L1 and the capacitor C1) of the matching circuit 10 are adjacent to the first side 201 of the outer edge 210 of the acoustic wave filter 20, and the two circuit elements (the first inductor L4 and the capacitor C2) of the hybrid filter 2 are adjacent to the second side 202 of the outer edge 210 of the acoustic wave filter 20. This allows the high frequency module 1 to shorten each of a wiring length between the acoustic wave filter 20 and the two electronic components (the inductor L1 and the capacitor C1) of the matching circuit 10 and a wiring length between the acoustic wave filter 20 and the two circuit elements (the first inductor L4 and the capacitor C2) of the hybrid filter 2.

(3.2) Communication Device

The communication device 300 according to the first embodiment includes the signal processing circuit 301 and the high frequency module 1. The signal processing circuit 301 performs signal-processing on high frequency signals (transmitted signals and received signals) used in the high frequency module 1.

Since the communication device 300 includes the high frequency module 1, it is possible to suppress the degradation of the characteristics.

Second Embodiment

Figure 6:
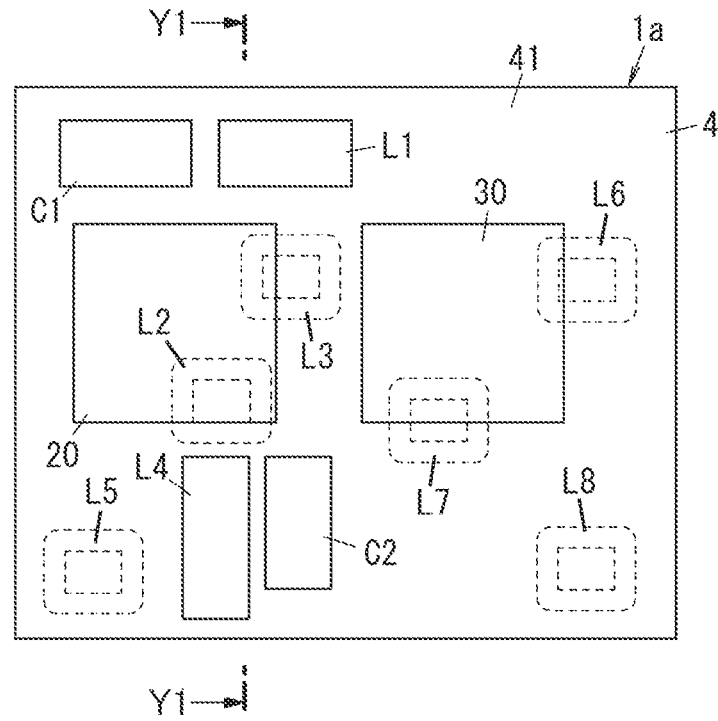
FIG. 6 is a plan view of a high frequency module according to a second embodiment.
Figure 7:
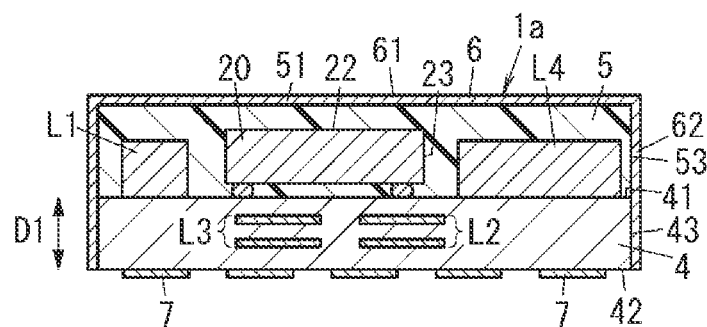
FIG. 7 illustrates the high frequency module of the second embodiment and is a sectional view of Y1-Y1 line in FIG. 6.

A high frequency module 1a according to a second embodiment is described with reference to FIGS. 6 and 7. Components of the high frequency module 1a according to the second embodiment, which are similar to those of the high frequency module 1 according to the first embodiment, are assigned with identical reference numerals, and a description thereof is omitted. Note that a circuit configuration of the high frequency module 1a is similar to that of the high frequency module 1 according to the first embodiment described with reference to FIG. 1.

In the hybrid filter 2 (see FIG. 1) in the high frequency module 1a according to the second embodiment, the shortest distance between the first inductor L1 and the metal electrode layer 6 is shorter than the shortest distance between the acoustic wave filter 20 and the metal electrode layer 6 and the shortest distance between the capacitor C2 and the metal electrode layer 6. In the high frequency module 1a, the shortest distance between the first inductor L4 and the second conductor part 62 of the metal electrode layer 6 is shorter than the shortest distance between the first inductor L4 and the first conductor part 61. In the high frequency module 1a, the resin layer 5 covers a principal surface 22 of the acoustic wave filter 20 on the side opposite to the mounting substrate 4 side and an outer peripheral surface 23 of the acoustic wave filter 20. The outer peripheral surface 23 of the acoustic wave filter 20 does not include the principal surface 22 of the acoustic wave filter 20 on the side opposite to the mounting substrate 4 side and the principal surface of the acoustic wave filter 20 on the mounting substrate 4 side.

Since the high frequency module 1a according to the second embodiment includes the inductor L5 (the second inductor L5), it is possible to suppress the degradation of the characteristics of the hybrid filter 2 due to the influence of the parasitic capacitance generated between the first inductor L4 and the metal electrode layer 6.

In addition, since the high frequency module 1a according to the second embodiment includes the inductor L8 (the third inductor L8), it is possible to suppress the degradation of the characteristics of the second filter 3.

Third Embodiment

Figure 8:
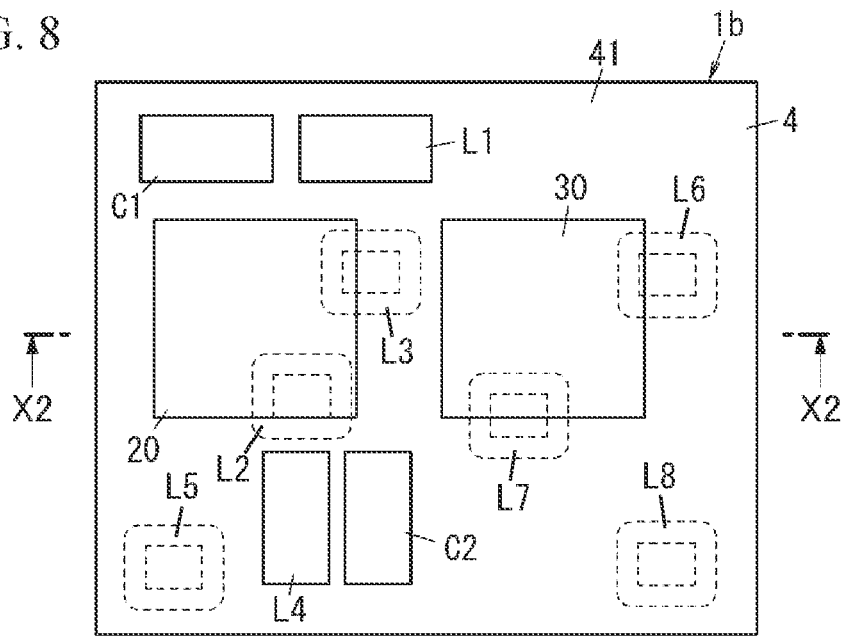
FIG. 8 is a plan view of a high frequency module according to a third embodiment.
Figure 9:
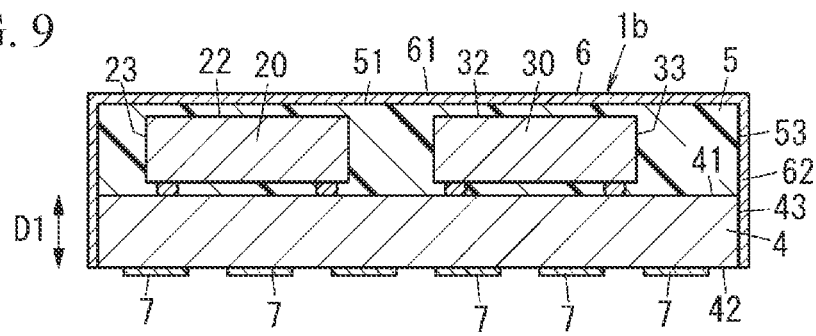
FIG. 9 illustrates the high frequency module of the third embodiment and is a sectional view of X2-X2 line in FIG. 8.

A high frequency module 1b according to a third embodiment is described with reference to FIGS. 8 and 9. Components of the high frequency module 1b according to the third embodiment, which are similar to those of the high frequency module 1 according to the first embodiment, are assigned with the identical reference numerals, and a description thereof is omitted. Note that a circuit configuration of the high frequency module 1b is similar to that of the high frequency module 1 according to the first embodiment described with reference to FIG. 1.

In the hybrid filter 2 (see FIG. 1) in the high frequency module 1b according to the third embodiment, the shortest distance between the acoustic wave filter 20 and the metal electrode layer 6 is shorter than the shortest distance between the first inductor L4 and the metal electrode layer 6 and the shortest distance between the capacitor C2 and the metal electrode layer 6. In the high frequency module 1b, the resin layer 5 covers the principal surface 22 of the acoustic wave filter 20 on the side opposite to the mounting substrate 4 side and the outer peripheral surface 23 of the acoustic wave filter 20. In addition, the resin layer 5 covers a principal surface 32 of the second acoustic wave filter 30 on the side opposite to the mounting substrate 4 side and an outer peripheral surface 33 of the second acoustic wave filter 30. The outer peripheral surface 23 of the acoustic wave filter 20 does not include the principal surface 22 of the acoustic wave filter 20 on the side opposite to the mounting substrate 4 side and the principal surface of the acoustic wave filter 20 on the mounting substrate 4 side. In addition, the outer peripheral surface 33 of the second acoustic wave filter 30 does not include the principal surface 32 of the second acoustic wave filter 30 on the side opposite to the mounting substrate 4 side and the principal surface of the second acoustic wave filter 30 on the mounting substrate 4 side.

Since the high frequency module 1b according to the third embodiment includes the second inductor L5, it is possible to suppress the degradation of the characteristics of the hybrid filter 2 due to the influence of the parasitic capacitance generated between the acoustic wave filter 20 and the metal electrode layer 6.

Figure 10:
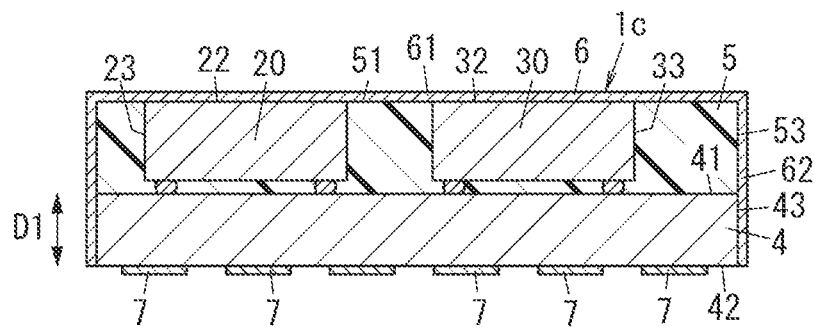
FIG. 10 is a sectional view of a high frequency module according to a modification example of the third embodiment.

As illustrated in FIG. 10, a high frequency module 1c according to the modification example of the third embodiment differs from the high frequency module 1b according to the third embodiment in that the principal surface 22 of the acoustic wave filter 20 on the side opposite to the mounting substrate 4 side is in contact with the metal electrode layer 6. In addition, the high frequency module 1c differs from the high frequency module 1b according to the third embodiment in that the principal surface 32 of the second acoustic wave filter 30 on the side opposite to the mounting substrate 4 side is in contact with the metal electrode layer 6.

In the high frequency module 1c, the metal electrode layer 6 is in contact with the entire principal surface 22 of the first acoustic wave filter 20 on the side opposite to the mounting substrate 4 side. Therefore, in the high frequency module 1c, heat generated in the first acoustic wave filter 20 is easily released from the metal electrode layer 6, which makes it possible to suppress the degradation of the filter characteristics. In addition, in the high frequency module 1c, the metal electrode layer 6 is in contact with the entire principal surface 32 of the second acoustic wave filter 30 on the side opposite to the mounting substrate 4 side. Therefore, in the high frequency module 1c, heat generated in the second acoustic wave filter 30 is easily released from the metal electrode layer 6, which makes it possible to suppress the degradation of the filter characteristics.

In addition, since the high frequency module 1c includes the inductor L5 (the second inductor L5), it is possible to suppress the degradation of the characteristics of the hybrid filter 2 due to the influence of the parasitic capacitance generated between the plurality of first IDT electrodes of the first acoustic wave filter 20 and the metal electrode layer 6. In addition, since the high frequency module 1c includes the inductor L8 (the third inductor L8), it is possible to suppress the degradation of characteristics of the second filter 3 due to the influence of the parasitic capacitance generated between the plurality of second IDT electrodes of the second acoustic wave filter 30 and the metal electrode layer 6.

Reference Examples

Figure 11:
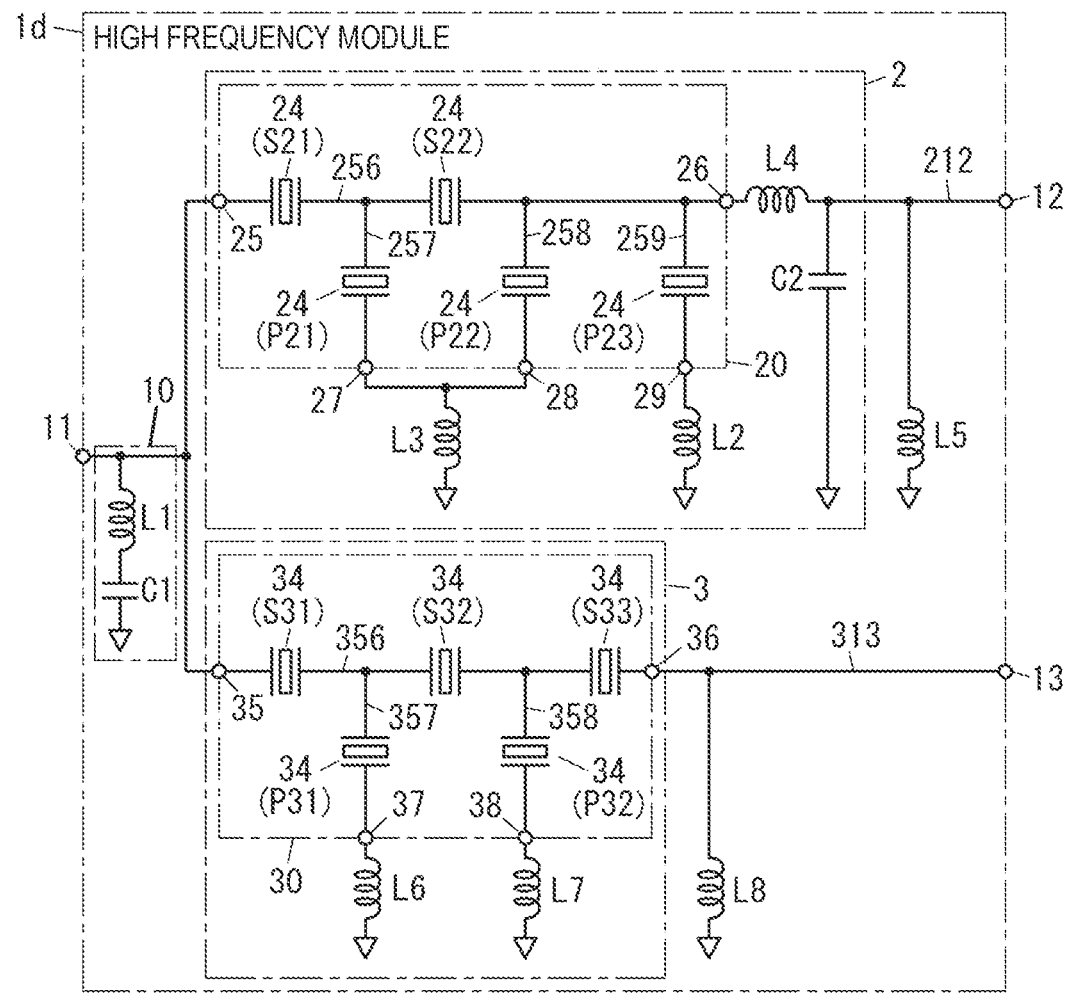
FIG. 11 is a circuit diagram of a high frequency module according to a reference example.

A high frequency module 1d according to a reference example is described with reference to FIG. 11. Components of the high frequency module 1d according to the reference example, which are similar to those of the high frequency module 1 according to the first embodiment, are assigned with the identical reference numerals, and a description thereof is omitted.

The high frequency module 1d according to the reference example differs from the high frequency module 1 according to the first embodiment in that the second inductor L5 is coupled between the signal path 212 and the ground terminal 7 (see FIG. 3). "The second inductor L5 is coupled between the signal path 212 and the ground terminal 7 (see FIG. 3)" means that the second inductor L5 is coupled to both the signal path 212 and the ground terminal 7 between the signal path 212 and the ground terminal 7. In addition, the high frequency module 1d according to the reference example differs from the high frequency module 1 in that the third inductor L8 is coupled between the signal path 313 and the ground terminal 7 (see FIG. 3). "The third inductor L8 is coupled between the signal path 313 and the ground terminal 7 (see FIG. 3)" means that the third inductor L8 is coupled to both the signal path 313 and the ground terminal 7 between the signal path 313 and the ground terminal 7.

In the high frequency module 1d according to the reference example, the inductance of the second inductor L5 ranges from 10 nH to 25 nH, for example, and is larger than that of the second inductor L5 in the high frequency module 1 according to the first embodiment. In addition, the high frequency module 1d according to the reference example differs from the high frequency module 1 according to the first embodiment in that the second inductor L5 is a chip inductor and that the second inductor L5 is mounted on the first principal surface 41 of the mounting substrate 4 (see FIGS. 2 and 3).

In addition, in the high frequency module 1d according to the reference example, the inductance of the third inductor L8 is larger than that of the third inductor L8 in the high frequency module 1 according to the first embodiment. In addition, the high frequency module 1d according to the reference example differs from the high frequency module 1 according to the first embodiment in that the third inductor L8 is the chip inductor and that the third inductor L8 is mounted on the first principal surface 41 of the mounting substrate 4 (see FIGS. 2 and 3).

Since the high frequency module 1d according to the reference example includes the second inductor L5, it is possible to suppress the degradation of the characteristics of the hybrid filter 2 due to the influence of the parasitic capacitance generated between the first acoustic wave filter 20 and the metal electrode layer 6. In addition, since the high frequency module 1d includes the third inductor L8, it is possible to suppress the degradation of the characteristics of the second filter 3 due to the influence of the parasitic capacitance generated between the second acoustic wave filter 30 and the metal electrode layer 6.

Fourth Embodiment

Figure 12:
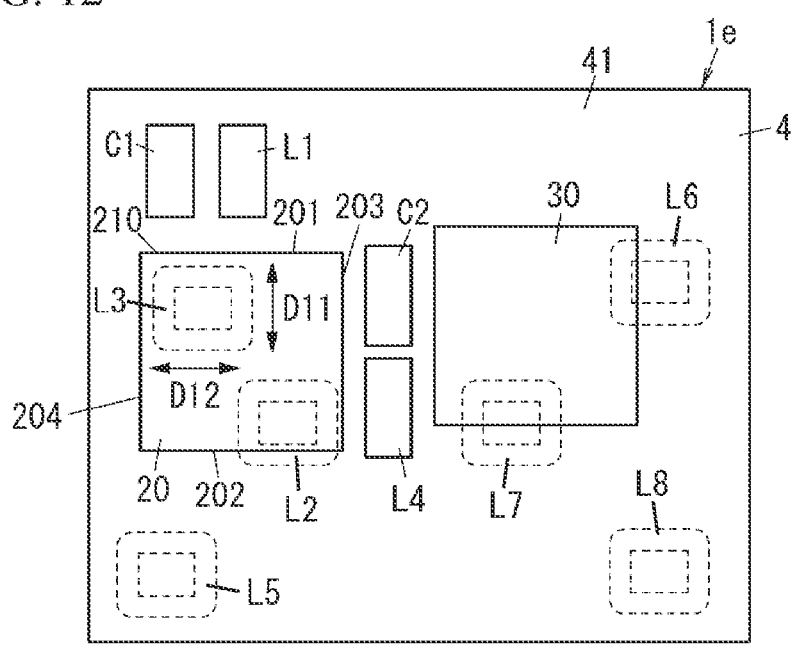
FIG. 12 is a plan view of a high frequency module according to a fourth embodiment.

A high frequency module 1e according to a fourth embodiment is described with reference to FIG. 12. Components of the high frequency module 1e according to the fourth embodiment, which are similar to those of the high frequency module 1 according to the first embodiment, are assigned with the identical reference numerals, and a description thereof is omitted. Note that a circuit configuration of the high frequency module 1e is similar to that of the high frequency module 1 according to the first embodiment described with reference to FIG. 1.

Similarly to the high frequency module 1 according to the first embodiment, in the high frequency module 1e according to the fourth embodiment, in plan view from the thickness direction D1 (see FIG. 3) of the mounting substrate 4, the two electronic components (the inductor L1 and the capacitor C1) of the matching circuit 10 (see FIG. 1) are adjacent to the first side 201 of the outer edge 210 of the acoustic wave filter 20.

In addition, in the high frequency module 1e according to the fourth embodiment, in plan view from the thickness direction D1 (see FIG. 3) of the mounting substrate 4, the two circuit elements (the first inductor L4 and the capacitor C2) of the hybrid filter 2 (see FIG. 1) are located along the third side 203 of the outer edge 210 of the acoustic wave filter 20. The two circuit elements (the first inductor L4 and the capacitor C2) of the hybrid filter 2 are side by side in a direction along the third side 203 of the outer edge 210 of the acoustic wave filter 20. In plan view from the thickness direction D1 of the mounting substrate 4, the two circuit elements (the first inductor L4 and the capacitor C2) of the hybrid filter 2 are adjacent to the third side 203 of the outer edge 210 of the acoustic wave filter 20. "The circuit elements are adjacent to the third side 203 of the acoustic wave filter 20" means that the circuit elements are separated from the third side 203 of the outer edge 210 of the acoustic wave filter 20, and that the circuit elements and the third side 203 of the acoustic wave filter 20 are adjacent to each other on the first principal surface 41 of the mounting substrate 4, with no other electronic component and circuit element between the circuit elements and the third side 203 of the acoustic wave filter 20. In the high frequency module 1e, in plan view from the thickness direction D1 of the mounting substrate 4, the capacitor C2 is disposed between the inductor L1 of the matching circuit 10 and the first inductor L4 of the hybrid filter 2 in the direction along the third side 203 of the outer edge 210 of the acoustic wave filter 20.

As described above, in the high frequency module 1e according to the fourth embodiment, in plan view from the thickness direction D1 of the mounting substrate 4, the acoustic wave filter 20 is disposed between the two circuit elements (the first inductor L4 and the capacitor C2) of the hybrid filter 2 and the two electronic components (the inductor L1 and the capacitor C1) of the matching circuit 10. This allows the high frequency module 1e according to the fourth embodiment to improve isolation between the two circuit elements (the first inductor L4 and the capacitor C2) of the hybrid filter 2 and the two electronic components (the inductor L1 and the capacitor C1) of the matching circuit 10.

In addition, in the high frequency module 1e, in plan view from the thickness direction D1 of the mounting substrate 4, the two electronic components (the inductor L1 and the capacitor C1) of the matching circuit 10 are adjacent to the first side 201 of the outer edge 210 of the acoustic wave filter 20, and the two circuit elements (the first inductor L4 and the capacitor C2) of the hybrid filter 2 are adjacent to the third side 203 of the outer edge 210 of the acoustic wave filter 20. This allows the high frequency module 1e to shorten each of the wiring length between the acoustic wave filter 20 and the two electronic components (the inductor L1 and the capacitor C1) of the matching circuit 10 and the wiring length between the acoustic wave filter 20 and the two circuit elements (the first inductor L4 and the capacitor C2) of the hybrid filter 2.

Modification Example

The above-described first to fourth embodiments or the like are merely an example of various embodiments of the present disclosure. Various sorts of changes can be made to the above-described first to fourth embodiments or the like, according to a design or the like.

For example, the high frequency module 1 does not have to be the multiplexer 100, and may be configured without necessarily the second acoustic wave filter 30 and the third inductor L8.

The multiplexer 100 forming the high frequency module 1 is not limited to a diplexer, and may be, for example, a triplexer including a third filter, in addition to the first filter 2 and the second filter 3. In addition, the multiplexer 100 may be a quadplexer including the third filter and a fourth filter, in addition to the first filter 2 and the second filter 3.

The hybrid filter 2 may be configured without necessarily at least one of the inductor L2 and the inductor L3. In addition, the second filter 3 may be configured without necessarily at least one of the inductor L6 and the inductor L7. In addition, the high frequency modules 1, 1a, 1b, 1c, 1d, and 1e may be configured without necessarily the inductor L1 and the capacitor C1. In addition, the first inductor L4 may only be disposed in or on the mounting substrate 4. The first inductor L4 is not limited to being mounted on the first principal surface 41 of the mounting substrate 4, and may be built into the mounting substrate 4. In addition, the capacitor C2 may only be disposed in or on the mounting substrate 4. The capacitor C2 is not limited to being mounted on the first principal surface 41 of the mounting substrate 4, and may be built into the mounting substrate 4. In addition, the resin layer 5 may only cover at least part of the acoustic wave filter 20.

In addition, in the high frequency modules 1, 1a, 1b, 1c, 1d, and 1e, for example, at least one of the inductor L1 and the capacitor C1 of the matching circuit 10 may be an electronic component (a first electronic component) mounted on the first principal surface 41 of the mounting substrate 4, and at least one of the first inductor L4 and the capacitor C2 of the hybrid filter 2 may be a circuit element (a second electronic component) mounted on the first principal surface 41 of the mounting substrate 4. In addition, the matching circuit 10 may include at least one of the inductor L1 and the capacitor C1. In addition, the circuit configuration of the matching circuit 10 is not limited to the example in FIG. 1.

In addition, in the high frequency modules 1, 1a, 1b, 1c, and 1e, the inductor L5 (the second inductor L5) is not limited to an inductor including the conductor pattern parts 45 formed in the mounting substrate 4, and may be, for example, the chip inductor mounted on the first principal surface 41 of the mounting substrate 4.

In addition, the high frequency modules 1, 1a, 1b, 1c, and 1e include the inductor L5 and the inductor L8, but may be configured without necessarily the inductor L5. In other words, the high frequency modules 1, 1a, 1b, 1c, and 1e may have a configuration in which the inductor L5 is not provided on the signal path 212 between the hybrid filter 2 and the second signal terminal 12. In this case, the inductor L8 forms the second inductor coupled between the second filter 3 and the third signal terminal 13. The second filter 3 is not limited to a configuration including the second acoustic wave filter 30, and may be an LC filter, for example. In this case, the inductor and the capacitor included in the second filter 3 may be mounted on the first principal surface 41 of the mounting substrate 4 or may be built into the mounting substrate 4.

In addition, the inductor L8 is not limited to an inductor including the conductor pattern parts 48 formed in the mounting substrate 4, and may be, for example, the chip inductor mounted on the first principal surface 41 of the mounting substrate 4.

In addition, the first acoustic wave filter 20 is not limited to being a surface acoustic wave filter, and may be a bulk acoustic wave filter. In the bulk acoustic wave filter, each of the plurality of acoustic wave resonators 24 is a bulk acoustic wave (BAW) resonator.

In addition, the second acoustic wave filter 30 is not limited to being the surface acoustic wave filter, and may be the bulk acoustic wave filter. In the bulk acoustic wave filter, each of the plurality of acoustic wave resonators 34 is the BAW resonator.

In addition, the first acoustic wave filter 20 is not limited to a ladder filter, and just has to include at least one acoustic wave resonator 24.

In addition, each of the first acoustic wave filter 20 and the second acoustic wave filter 30 may be, for example, an acoustic wave filter that utilizes boundary acoustic waves, lamb waves, or the like.

In addition, in the high frequency modules 1, 1b, 1c, 1d, and 1e, the metal electrode layer 6 may only include at least the first conductor part 61 of the first conductor part 61 and the second conductor part 62. In addition, in the high frequency module 1a, the metal electrode layer 6 may only include at least the second conductor part 62 of the first conductor part 61 and the second conductor part 62.

In addition, each of the plurality of external connection terminals (the first signal terminal 11, the second signal terminal 12, the third signal terminal 13, and the plurality of ground terminals 7) in the high frequency module 1 may be a ball bump. Examples of materials of the ball bump forming each of the plurality of external connection terminals include gold, copper, a solder, or the like.

Figure 5:
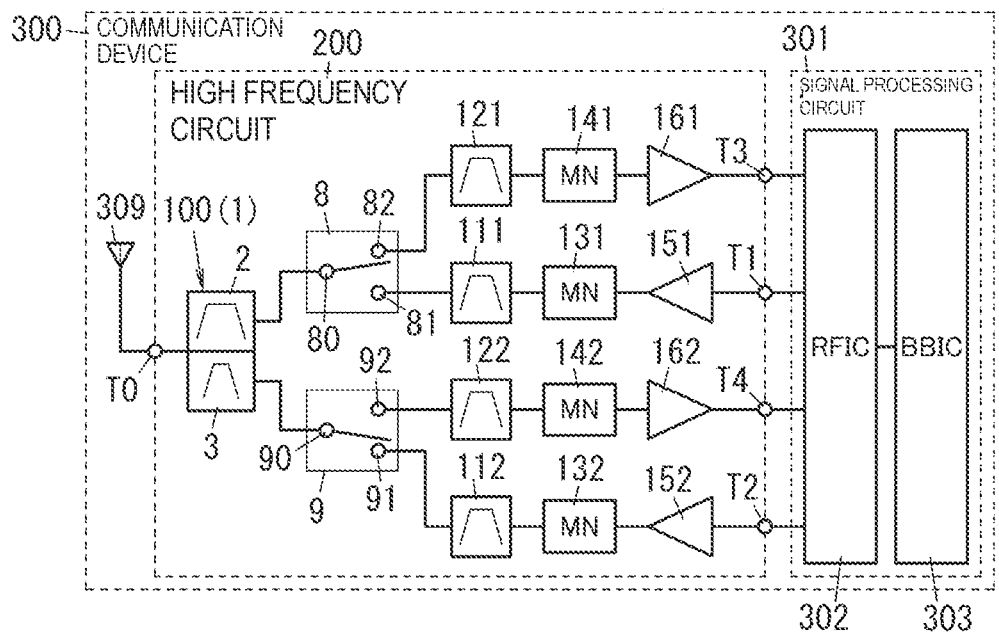
FIG. 5 is a circuit configuration diagram of a communication device including the high frequency module of the first embodiment.

The circuit configuration of the high frequency circuit 200 is not limited to the above-described example of FIG. 5. The high frequency circuit 200 may have, as the circuit configuration, a high frequency front end circuit compatible with multi-input multi-output (MIMO) or compatible with Evolved-Universal Terrestrial Radio Access New Radio Dual Connectivity (ENDC), for example.

Aspects

The following aspects are disclosed herein.

High frequency modules (1; 1a; 1b; 1c; 1e) according to a first aspect include a mounting substrate (4); a first signal terminal (11), a second signal terminal (12), and ground terminals (7); and a hybrid filter (2). The mounting substrate (4) has a first principal surface (41) and a second principal surface (42) that are opposed to each other. The first signal terminal (11), the second signal terminal (12), and the ground terminals (7) are disposed on the mounting substrate (4). The hybrid filter (2) is coupled between the first signal terminal (11) and the second signal terminal (12). The hybrid filter (2) includes an acoustic wave filter (20) having at least one acoustic wave resonator (24), a first inductor (L4), and a capacitor (C2). A pass band width of the hybrid filter (2) is larger than that of the acoustic wave resonator (24). The acoustic wave filter (20) is mounted on the first principal surface (41) of the mounting substrate (4). The first inductor (L4) and the capacitor (C2) are disposed in or on the mounting substrate (4). The high frequency modules (1; 1a; 1b; 1c; 1e) further include a resin layer (5), a metal electrode layer (6), and a second inductor (L5). The resin layer (5) is disposed on the first principal surface (41) of the mounting substrate (4). The resin layer (5) covers at least part of the acoustic wave filter (20). The metal electrode layer (6) covers at least part of the resin layer (5), and is coupled to the ground terminals (7). The second inductor (L5) is disposed in or on the mounting substrate (4). The second inductor (L5) is coupled between the hybrid filter (2) and the second signal terminal (12).

In the high frequency modules (1; 1a; 1b; 1c; 1e) according to the first aspect, it is possible to suppress degradation of characteristics.

High frequency modules (1; 1a; 1b; 1c; 1e) according to a second aspect include a mounting substrate (4); a first signal terminal (11), a second signal terminal (12), a third signal terminal (13), and ground terminals (7); a first filter (2); and a second filter (3). The first filter (2) is a hybrid filter (2) that includes a first acoustic wave filter (20) having at least one acoustic wave resonator (24), a first inductor (L4), and a capacitor (C2). The mounting substrate (4) has a first principal surface (41) and a second principal surface (42) that are opposed to each other. The first signal terminal (11), the second signal terminal (12), the third signal terminal (13), and the ground terminals (7) are disposed on the mounting substrate (4). The hybrid filter (2) is coupled between the first signal terminal (11) and the second signal terminal (12). The second filter (3) is coupled between the first signal terminal (11) and the third signal terminal (13). A pass band width of the hybrid filter (2) is larger than that of the acoustic wave resonator (24). The acoustic wave filter (20) is mounted on the first principal surface (41) of the mounting substrate (4). The second filter (3), the first inductor (L4), and the capacitor (C2) are disposed in or on the mounting substrate (4). The high frequency modules (1; 1a; 1b; 1c; 1e) further includes a resin layer (5), a metal electrode layer (6), and a second inductor (inductor L8). The resin layer (5) is disposed on the first principal surface (41) of the mounting substrate (4). The resin layer (5) covers at least part of the acoustic wave filter (20). The metal electrode layer (6) covers at least part of the resin layer (5), and is coupled to the ground terminals (7). The second inductor (the inductor L8) is disposed in or on the mounting substrate (4). The second inductor (inductor L8) is coupled between the second filter (3) and the third signal terminal (13).

In the high frequency modules (1; 1a; 1b; 1c; 1e) according to the second aspect, it is possible to suppress degradation of characteristics.

In high frequency modules (1; 1a; 1b; 1c; 1e) according to a third aspect, in the first aspect, the second inductor (L5) is an inductor that includes a conductor pattern part (45) formed in the mounting substrate (4).

The high frequency modules (1; 1a; 1b; 1c; 1e) according to the third aspect can reduce an outline size of the high frequency modules (1; 1a; 1b; 1c; 1e) in plan view from a thickness direction (D1) of the mounting substrate (4).

In high frequency modules (1; 1a; 1b; 1c; 1e) according to a fourth aspect, in the third aspect, the second signal terminal (12) is disposed on the second principal surface (42) of the mounting substrate (4). In plan view from the thickness direction (D1) of the mounting substrate (4), the second inductor (L5) overlaps the second signal terminal (12).

The high frequency modules (1; 1a; 1b; 1c; 1e) according to the fourth aspect can shorten a wiring length between the second inductor (L5) and the second signal terminal (12).

High frequency modules (1; 1a; 1b; 1c; 1e) according to a fifth aspect further include a third signal terminal (13), a second acoustic wave filter (30), and a third inductor (L8), in any one of the first, third, and fourth aspects. The third signal terminal (13) is disposed on the mounting substrate (4). The second acoustic wave filter (30) is an electronic component different from the first acoustic wave filter (20) which is the acoustic wave filter (20). The second acoustic wave filter (30) is mounted on the first principal surface (41) of the mounting substrate (4), and is coupled between the first signal terminal (11) and the third signal terminal (13). The third inductor (L8) is disposed in or on the mounting substrate (4). The third inductor (L8) is coupled between the second acoustic wave filter (30) and the third signal terminal (13).

In the high frequency modules (1; 1a; 1b; 1c; 1e) according to the fifth aspect, it is possible to suppress degradation of characteristics of the filter (the second filter 3) including the second acoustic wave filter (30).

In high frequency modules (1; 1a; 1b; 1c; 1e) according to a sixth aspect, in the fifth aspect, the third inductor (L8) is an inductor that includes a conductor pattern part (48) formed in the mounting substrate (4).

In high frequency modules (1; 1a; 1b; 1c; 1e) according to a seventh aspect, in the fifth or sixth aspect, the mounting substrate (4) further has a conductor part (49). In plan view from the thickness direction (D1) of the mounting substrate (4), the conductor part (49) is disposed between the second inductor (L5) and the third inductor (L8), and is coupled to the ground terminals (7).

In the high frequency modules (1; 1a; 1b; 1c; 1e) according to the seventh aspect, it is possible to improve isolation between the second inductor (L5) and the third inductor (L8) and suppress the degradation of the characteristics of the hybrid filter (2).

In high frequency modules (1; 1a; 1b; 1c; 1e) according to an eighth aspect, in the seventh aspect, the conductor part (49) includes a ground layer (491). The ground layer (491) is disposed between the first principal surface (41) and the second principal surface (42) of the mounting substrate (4), and intersects the thickness direction (D1) of the mounting substrate (4).

In the high frequency modules (1; 1a; 1b; 1c; 1e) according to the eighth aspect, it is possible to improve isolation between the second inductor (L5) and the third inductor (L8).

High frequency modules (1; 1e) according to a ninth aspect are based on any one of the first and third to eighth aspects. In the hybrid filter (2), the shortest distance between the first inductor (L4) and the metal electrode layer (6) is shorter than the shortest distance between the acoustic wave filter (20) and the metal electrode layer (6) and the shortest distance between the capacitor (C2) and the metal electrode layer (6).

In the high frequency modules (1; 1e) according to the ninth aspect, it is possible to suppress the degradation of characteristics of the hybrid filter (2) due to influence of parasitic capacitance generated between the first inductor (L4) and the metal electrode layer (6).

High frequency modules (1b; 1c) according to a tenth aspect are based on any of the first and third to eighth aspects. In the hybrid filter (2), the shortest distance between the acoustic wave filter (20) and the metal electrode layer (6) is shorter than the shortest distance between the first inductor (L4) and the metal electrode layer (6) and the shortest distance between the capacitor (C2) and the metal electrode layer (6).

In the high frequency modules (1b; 1c) according to the tenth aspect, it is possible to suppress the degradation of the characteristics of the hybrid filter (2) due to influence of parasitic capacitance generated between the acoustic wave filter (20) and the metal electrode layer (6).

A high frequency module (1c) according to an eleventh aspect is based on the tenth aspect. In the hybrid filter (2), a principal surface (22) of the acoustic wave filter (20) on the side opposite to the mounting substrate (4) side is in contact with the metal electrode layer (6).

In the high frequency module (1c) according to the eleventh aspect, heat generated at the acoustic wave filter (20) is easily released from the metal electrode layer (6), and it is possible to suppress the degradation of characteristics of the hybrid filter (2) due to influence of parasitic capacitance generated between the acoustic wave filter (20) and the metal electrode layer (6).

In high frequency modules (1; 1a; 1b; 1c; 1e) according to a twelfth aspect, in the second aspect, the second inductor (the inductor L8) is an inductor that includes a conductor pattern part (48) formed in the mounting substrate (4).

The high frequency modules (1; 1a; 1b; 1c; 1e) according to the twelfth aspect can reduce an outline size of the high frequency modules (1; 1a; 1b; 1c) in plan view from the thickness direction (D1) of the mounting substrate (4).

In high frequency modules (1; 1a; 1b; 1c; 1e) according to a thirteenth aspect, in the twelfth aspect, the third signal terminal (13) is disposed on the second principal surface (42) of the mounting substrate (4). The second inductor (the inductor L8) overlaps the third signal terminal (13) in plan view from a thickness direction (D1) of the mounting substrate (4).

The high frequency modules (1; 1a; 1b; 1c; 1e) according to the thirteenth aspect can further shorten a wiring length between the second inductor (the inductor L8) and the third signal terminal (13).

High frequency modules (1; 1a; 1b; 1c; 1e) according to a fourteenth aspect further include a matching circuit (10) in any one of the first to thirteenth aspects. The matching circuit (10) is coupled between the first signal terminal (11) and the acoustic wave filter (20). The matching circuit (10) has at least one electronic component (the inductor L1 and the capacitor C1) mounted on the first principal surface (41) of the mounting substrate (4). At least one circuit element out of the first inductor (L4) and the capacitor (C2) is mounted on the first principal surface (41) of the mounting substrate (4). In plan view from a thickness direction (D1) of the mounting substrate (4), the acoustic wave filter (20) is disposed between the at least one circuit element (the first inductor L4 and the capacitor C2) and the at least one electronic component (the inductor L1 and the capacitor C1).

The high frequency modules (1; 1a; 1b; 1c; 1e) according to the fourteenth aspect can improve isolation between the at least one circuit element (the first inductor L4 and the capacitor C2) and the at least one electronic components (the inductor L1 and the capacitor C1).

In high frequency modules (1; 1a; 1b; 1c) according to a fifteenth aspect, in the fourteenth aspect, in plan view from the thickness direction (D1) of the mounting substrate (4), an outer edge (210) of the acoustic wave filter (20) includes a first side (201) and a second side (202) that are opposed to each other in a first direction (D11). In plan view from the thickness direction (D1) of the mounting substrate (4), the at least one electronic component (the inductor L1 and the capacitor C1) is adjacent to the first side (201) of the outer edge (210) of the acoustic wave filter (20), and the at least one circuit element (the first inductor L4 and the capacitor C2) is adjacent to the second side (202) of the outer edge (210) of the acoustic wave filter (20).

The high frequency modules (1; 1a; 1b; 1c) according to the fifteenth aspect can shorten a wiring length between the acoustic wave filter (20) and the at least one electronic component (the inductor L1 and the capacitor C1) and the wiring length between the acoustic wave filter (20) and the at least one circuit element (the first inductor L4 and the capacitor C2).

In a high frequency module (1e) according to a sixteenth aspect, in the fourteenth aspect, in plan view from the thickness direction (D1) of the mounting substrate (4), an outer edge (210) of the acoustic wave filter (20) includes a first side (201) and a second side (202) that are opposed to each other in a first direction (D11) as well as a third side (203) and a fourth side (204) that are opposed to each other in a second direction (D12) that is orthogonal to the first direction (D11). In plan view from the thickness direction (D1) of the mounting substrate (4), the at least one electronic component (the inductor L1 and the capacitor C1) is adjacent to the first side (201) of the outer edge (210) of the acoustic wave filter (20), and the at least one circuit element (the first inductor L4 and the capacitor C2) is adjacent to the third side (203) of the outer edge (210) of the acoustic wave filter (20).

The high frequency module (1e) according to the sixteenth aspect can shorten each of the wiring length between the acoustic wave filter (20) and the at least one electronic component (the inductor L1 and the capacitor C1) and the wiring length between the acoustic wave filter (20) and the at least one circuit element (the first inductor L4 and the capacitor C2).

In high frequency modules (1; 1a; 1b; 1c; 1e) according to a seventeenth aspect, in any one of the fourteenth to sixteenth aspects, the matching circuit (10) has a plurality of electronic components. The plurality of electronic components include a chip inductor (the inductor L1) and a chip capacitor (the capacitor C1).

A communication device (300) according to an eighteenth aspect includes the high frequency modules (1; 1a; 1b; 1c; 1e) of any one of the first to seventeenth aspects and a signal processing circuit (301). The signal processing circuit (301) performs signal-processing on a high frequency signal for use in the high frequency modules (1; 1a; 1b; 1c; 1e).

In the communication device (300) according to the eighteenth aspect, it is possible to suppress degradation of characteristics.

A high frequency module (1d) according to a nineteenth aspect includes a mounting substrate (4); a first signal terminal (11), a second signal terminal (12), and ground terminals (7); and a hybrid filter (2). The mounting substrate (4) has a first principal surface (41) and a second principal surface (42) that are opposed to each other. The first signal terminal (11), the second signal terminal (12), and the ground terminals (7) are disposed on the mounting substrate (4). The hybrid filter (2) is coupled between the first signal terminal (11) and the second signal terminal (12). The hybrid filter (2) includes an acoustic wave filter (20) having at least one acoustic wave resonator (24), a first inductor (L4), and a capacitor (C2). A pass band width of the hybrid filter (2) is larger than that of the acoustic wave resonator (24). The acoustic wave filter (20) is mounted on the first principal surface (41) of the mounting substrate (4). The first inductor (L4) and the capacitor (C2) are disposed in or on the mounting substrate (4). The high frequency module (1d) further includes a resin layer (5), a metal electrode layer (6), and a second inductor (L5). The resin layer (5) is disposed on the first principal surface (41) of the mounting substrate (4). The resin layer (5) covers at least part of the acoustic wave filter (20). The metal electrode layer (6) covers at least part of the resin layer (5), and is coupled to the ground terminals (7). The second inductor (L5) is disposed in or on the mounting substrate (4). The second inductor (L5) is coupled between the ground terminals (7) and a signal path (212) between the hybrid filter (2) and the second signal terminal (12).

In the high frequency module (1d) according to the nineteenth aspect, it is possible to suppress degradation of characteristics.

REFERENCE SIGNS LIST 1, 1a, 1b, 1c, 1d, 1e High frequency module
2 Hybrid filter (First filter)
20 Acoustic wave filter (First acoustic wave filter)
22 Principal surface
23 Outer peripheral surface
24 Acoustic wave resonator
25 First input/output electrode 26 Second input/output electrode
27 Ground electrode
28 Ground electrode
29 Ground electrode
201 First side
202 Second side
203 Third side
204 Fourth side
210 Outer edge
212 Signal path
256 Path (Series-arm path)
257 Path (Parallel-arm path)
258 Path (Parallel-arm path)
259 Path (Parallel-arm path)
3 Second filter
32 Principal surface
33 Outer peripheral surface
34 Acoustic wave resonator
35 First input/output electrode
36 Second input/output electrode
37 Ground electrode
38 Ground electrode
313 Signal path
356 Path (Series-arm path)
357 Path (Parallel-arm path)
358 Path (Parallel-arm path)
4 Mounting substrate
41 First principal surface
42 Second principal surface
43 Outer peripheral surface
45 Conductor pattern part
48 Conductor pattern part
49 Conductor part
450 Via conductor
451 Via conductor
452 Via conductor
480 Via conductor
481 Via conductor
482 Via conductor
490 Via conductor
491 Ground layer
5 Resin layer
51 Principal surface
53 Outer peripheral surface
6 Metal electrode layer
61 First conductor part
62 Second conductor part
7 Ground terminal
8 First switch
80 Common terminal
81 Selection terminal
82 Selection terminal
9 Second switch
90 Common terminal
91 Selection terminal
92 Selection terminal
10 Matching circuit
11 First signal terminal
12 Second signal terminal
13 Third signal terminal
111 First transmitting filter
112 Second transmitting filter
121 First receiving filter
122 Second receiving filter
131 First output matching circuit
132 Second output matching circuit
141 First input matching circuit
142 Second input matching circuit
151 First power amplifier
152 Second power amplifier
161 First low-noise amplifier
162 Second low-noise amplifier
200 High frequency circuit
300 Communication device
301 Signal processing circuit
302 RF signal processing circuit
303 Baseband signal processing circuit
309 Antenna
C1 Capacitor
C2 Capacitor
D1 Thickness direction
D11 First direction
D12 Second direction
L1 Inductor
L2 Inductor
L3 Inductor
L4 First inductor
L5 Inductor (Second inductor)
L6 Inductor
L7 Inductor
L8 Inductor (Third inductor, second inductor)
S21, S22 Series-arm resonator
S31, S32, S33 Series-arm resonator
P21, P22, P23 Parallel-arm resonator
P31, P32 Parallel-arm resonator
T0 Antenna terminal
T1 First signal input terminal
T2 Second signal input terminal
T3 First signal output terminal
T4 Second signal output terminal

The invention claimed is:

1. A high frequency module comprising:
a mounting substrate having a first principal surface and a second principal surface that are opposed to each other;
a first signal terminal, a second signal terminal, and a ground terminal that are on the mounting substrate; and
a hybrid filter coupled between the first signal terminal and the second signal terminal, wherein the hybrid filter comprises:
an acoustic wave filter comprising at least one acoustic wave resonator;
a first inductor; and
a capacitor,
wherein a pass band width of the hybrid filter is larger than a pass band width of the acoustic wave resonator,
wherein the acoustic wave filter is on the first principal surface of the mounting substrate,
wherein the first inductor and the capacitor are in or on the mounting substrate, and
wherein the high frequency module further comprises:
a resin layer that is on the first principal surface of the mounting substrate and that covers at least part of the acoustic wave filter;
a metal electrode layer that covers at least part of the resin layer and that is coupled to the ground terminal; and
a second inductor that is in or on the mounting substrate, and that is coupled in series between the hybrid filter and the second signal terminal.

2. A high frequency module comprising:
a mounting substrate having a first principal surface and a second principal surface that are opposed to each other;

a first signal terminal, a second signal terminal, a third signal terminal, and a ground terminal that are on the mounting substrate;
a first filter that is a hybrid filter coupled between the first signal terminal and the second signal terminal, and that comprises an acoustic wave filter comprising at least one acoustic wave resonator, a first inductor, and a capacitor; and
a second filter that is coupled between the first signal terminal and the third signal terminal, wherein a pass band width of the hybrid filter is larger than a pass band width of the acoustic wave resonator,
wherein the acoustic wave filter is on the first principal surface of the mounting substrate,
wherein the second filter, the first inductor, and the capacitor are in or on the mounting substrate, and
wherein the high frequency module further comprises:
a resin layer that is on the first principal surface of the mounting substrate and that covers at least part of the acoustic wave filter;
a metal electrode layer that covers at least part of the resin layer and that is coupled to the ground terminal; and
a second inductor that is in or on the mounting substrate, and that is coupled between the second filter and the third signal terminal.

3. The high frequency module according to claim 1, wherein the second inductor includes a conductor pattern in the mounting substrate.

4. The high frequency module according to claim 3, wherein the second signal terminal is on the second principal surface of the mounting substrate, and
wherein in plan view from a thickness direction of the mounting substrate, the second inductor overlaps the second signal terminal.

5. The high frequency module according to claim 1, further comprising:
a third signal terminal on the mounting substrate;
a second acoustic wave filter that is an electronic component different from the acoustic wave filter, that is on the first principal surface of the mounting substrate, and that is coupled between the first signal terminal and the third signal terminal; and
a third inductor that is in or on the mounting substrate, and that is coupled between the second acoustic wave filter and the third signal terminal.

6. The high frequency module according to claim 5, wherein the third inductor includes a conductor pattern in the mounting substrate.

7. The high frequency module according to claim 5, wherein the mounting substrate further has a conductor that is between the second inductor and the third inductor in plan view from a thickness direction of the mounting substrate, and is coupled to the ground terminal.

8. The high frequency module according to claim 7, wherein the conductor comprises a ground layer that is between the first principal surface and the second principal surface of the mounting substrate, and that intersects the thickness direction of the mounting substrate.

9. The high frequency module according to claim 1, wherein in the hybrid filter, a shortest distance between the first inductor and the metal electrode layer is shorter than a shortest distance between the acoustic wave filter and the metal electrode layer and a shortest distance between the capacitor and the metal electrode layer.

10. The high frequency module according to claim 1, wherein in the hybrid filter, a shortest distance between the acoustic wave filter and the metal electrode layer is shorter than a shortest distance between the first inductor and the metal electrode layer and a shortest distance between the capacitor and the metal electrode layer.

11. The high frequency module according to claim 10, wherein in the hybrid filter, a principal surface of the acoustic wave filter on a side opposite to a side of the mounting substrate is in contact with the metal electrode layer.

12. The high frequency module according to claim 2, wherein the second inductor includes a conductor pattern in the mounting substrate.

13. The high frequency module according to claim 12, wherein the third signal terminal is on the second principal surface of the mounting substrate, and
wherein in plan view from a thickness direction of the mounting substrate, the second inductor overlaps the third signal terminal.

14. The high frequency module according to claim 1, further comprising:
a matching circuit coupled between the first signal terminal and the acoustic wave filter, wherein the matching circuit comprises at least one electronic component on the first principal surface of the mounting substrate,
wherein the first inductor or the capacitor is a circuit element on the first principal surface of the mounting substrate, and
wherein in plan view from a thickness direction of the mounting substrate, the acoustic wave filter is between the circuit element on the first principal surface of the mounting substrate and the at least one electronic component on the first principal surface of the mounting substrate.

15. The high frequency module according to claim 2, further comprising:
a matching circuit coupled between the first signal terminal and the acoustic wave filter, wherein the matching circuit comprises at least one electronic component on the first principal surface of the mounting substrate,
wherein the first inductor or the capacitor is a circuit element on the first principal surface of the mounting substrate, and
wherein in plan view from a thickness direction of the mounting substrate, the acoustic wave filter is between the circuit element on the first principal surface of the mounting substrate and the at least one electronic component on the first principal surface of the mounting substrate.

16. The high frequency module according to claim 14, wherein in plan view from the thickness direction of the mounting substrate, an outer edge of the acoustic wave filter includes a first side and a second side that are opposed to each other in a first direction, and
wherein in the plan view from the thickness direction of the mounting substrate:
the at least one electronic component on the first principal surface of the mounting substrate is adjacent to the first side of the outer edge of the acoustic wave filter, and
the at circuit element on the first principal surface of the mounting substrate is adjacent to the second side of the outer edge of the acoustic wave filter.

17. The high frequency module according to claim 14, wherein in the plan view from the thickness direction of the mounting substrate, an outer edge of the acoustic wave filter includes:

a first side and a second side that are opposed to each other in a first direction, and a third side and a fourth side that are opposed to each other in a second direction orthogonal to the first direction, and wherein in the plan view from the thickness direction of the mounting substrate:

the at least one electronic component on the first principal surface of the mounting substrate is adjacent to the first side of the outer edge of the acoustic wave filter, and the circuit element on the first principal surface of the mounting substrate is adjacent to the third side of the outer edge of the acoustic wave filter.

18. The high frequency module according to claim 14, wherein the matching circuit comprises a chip inductor and a chip capacitor, and wherein the chip inductor and the chip capacitor are on the first principal surface of the mounting substrate.

19. A communication device comprising:

the high frequency module according to claim 1; and a signal processing circuit configured to process a high frequency signal for use in the high frequency module.

20. A communication device comprising:

the high frequency module according to claim 2; and a signal processing circuit configured to process a high frequency signal for use in the high frequency module.

* * * * *

UNITED STATES PATENT AND TRADEMARK OFFICE
CERTIFICATE OF CORRECTION

| | | |
|---|---|---|
| PATENT NO. | : 12,445,111 B2 | Page 1 of 1 |
| APPLICATION NO. | : 18/457444 | |
| DATED | : October 14, 2025 | |
| INVENTOR(S) | : Keisuke Nishio et al. | |

It is certified that error appears in the above-identified patent and that said Letters Patent is hereby corrected as shown below:

In the Specification

Column 8, Line 41, "input/output electrode coupled" should be --input/output electrode 25 coupled--

Signed and Sealed this
Sixteenth Day of December, 2025

John A. Squires
*Director of the United States Patent and Trademark Office*